US012471465B2

(12) United States Patent
Chai et al.

(10) Patent No.: US 12,471,465 B2
(45) Date of Patent: Nov. 11, 2025

(54) DISPLAY PANEL AND DISPLAY APPARATUS

(71) Applicants: WUHAN TIANMA MICRO-ELECTRONICS CO., LTD., Wuhan (CN); Wuhan Tianma Microelectronics Co., Ltd. Shanghai Branch, Shanghai (CN)

(72) Inventors: Huiping Chai, Wuhan (CN); Gaojun Huang, Wuhan (CN); Lin Zhang, Wuhan (CN)

(73) Assignees: Wuhan TianMa Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 17 days.

(21) Appl. No.: 18/421,438

(22) Filed: Jan. 24, 2024

(65) Prior Publication Data

US 2024/0164162 A1 May 16, 2024

(30) Foreign Application Priority Data

Feb. 22, 2023 (CN) ......................... 202310162416.2

(51) Int. Cl.
*G09G 3/00* (2006.01)
*G09G 3/3225* (2016.01)
*H10K 59/131* (2023.01)

(52) U.S. Cl.
CPC ......... *H10K 59/131* (2023.02); *G09G 3/3225* (2013.01); *G09G 2300/0819* (2013.01);
(Continued)

(58) Field of Classification Search
CPC ... G09G 2300/0819; G09G 2300/0842; G09G 2300/0861; G09G 2320/0223;
(Continued)

(56) References Cited

U.S. PATENT DOCUMENTS

| | | | | |
|---|---|---|---|---|
| 2021/0143150 A1* | 5/2021 | Chang | ................. | H01L 23/5226 |
| 2021/0202460 A1* | 7/2021 | Shin | ......................... | H01L 25/18 |
| 2022/0358880 A1* | 11/2022 | Yonebayashi | ........ | G09G 3/3233 |

FOREIGN PATENT DOCUMENTS

| | | |
|---|---|---|
| CN | 102201189 A | 9/2011 |
| CN | 110148610 A | 8/2019 |

(Continued)

OTHER PUBLICATIONS

Chinese First Office Action (English translation included) received for Chinese Application No. 202310162416.2, filed Feb. 22, 2023, and mailed on Apr. 25, 2025; 20 pages total.

*Primary Examiner* — Insa Sadio
(74) *Attorney, Agent, or Firm* — Christensen O'Connor Johnson Kindness PLLC

(57) ABSTRACT

Provided are a display panel and a display apparatus. The display panel includes a substrate, gating lines and pixels. The gating lines extend in a first direction. Each pixel includes a pixel circuit including a functional transistor. The functional transistor includes a patterned conductive structure. A gate of the functional transistor is located in the conductive structure. The conductive structure is electrically connected to the gating line through a via. A sheet resistance of a layer where the gating line is located is lower than a sheet resistance of a layer where the conductive structure is located.

27 Claims, 21 Drawing Sheets

(52) U.S. Cl.
CPC ............... *G09G 2300/0842* (2013.01); *G09G 2300/0861* (2013.01); *G09G 2320/0223* (2013.01); *G09G 2320/0233* (2013.01); *G09G 2330/08* (2013.01)

(58) Field of Classification Search
CPC ....... G09G 2320/0233; G09G 2330/08; G09G 3/3225; H10K 59/131
See application file for complete search history.

(56) References Cited

FOREIGN PATENT DOCUMENTS

| | | | |
|---|---|---|---|
| CN | 112885850 | A | 6/2021 |
| CN | 113516947 | A | 10/2021 |
| CN | 113990887 | A | 1/2022 |

* cited by examiner

DISPLAY PANEL AND DISPLAY APPARATUS

CROSS-REFERENCE TO RELATED APPLICATIONS

The present application claims priority to Chinese Patent Application No. 202310162416.2, filed on Feb. 22, 2023, the content of which is incorporated herein by reference in its entirety.

TECHNICAL FIELD

The present disclosure relates to the technical field of display, and in particular, to a display panel and a display apparatus.

BACKGROUND

Organic light-emitting diodes (OLEDs), with the advantages of self-illumination, high brightness, low power consumption, fast response, high definition, good flexibility, and high luminous efficiency, can meet the new demands of consumers for the display technology. The current OLED display panels are mostly driven actively, with pixel circuits disposed in the display panel and a plurality of signal lines connected to the pixel circuits. However, the heavy load on some of the signal lines affects the uniformity of the display.

SUMMARY

Embodiments of the present disclosure provide a display panel and a display apparatus capable of improving the display uniformity.

According to an aspect, a display panel is provided. The display panel includes a substrate, and gating lines and pixels that are located on one side of the substrate. The gating lines extend in a first direction. A pixel of the pixels includes a pixel circuit including a functional transistor. The functional transistor includes a patterned conductive structure. A gate of the functional transistor is located in the conductive structure. The conductive structure is electrically connected to the gating line through a via. A sheet resistance of a layer where the gating line is located is lower than a sheet resistance of a layer where the conductive structure is located.

According to another aspect, a display apparatus is provided. The display apparatus includes a display panel. The display panel includes a substrate, and gating lines and pixels that are located on one side of the substrate. The gating lines extend in a first direction. A pixel of the pixels includes a pixel circuit including a functional transistor. The functional transistor includes a patterned conductive structure. A gate of the functional transistor is located in the conductive structure. The conductive structure is electrically connected to the gating line through a via. A sheet resistance of a layer where the gating line is located is lower than a sheet resistance of a layer where the conductive structure is located.

BRIEF DESCRIPTION OF DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person skilled in the art may still derive other drawings from these accompanying drawings.

DESCRIPTION OF EMBODIMENTS

In order to make the objectives, technical solutions and advantages of the embodiments of the present disclosure clearer, the technical solutions in the embodiments of the present disclosure will be clearly and completely described below in conjunction with the drawings in the embodiments of the present disclosure. The described embodiments are some, rather than all of the embodiments of the present disclosure. All other embodiments obtained by those of ordinary skill in the art based on the embodiments of the present disclosure should fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

Figure 1:
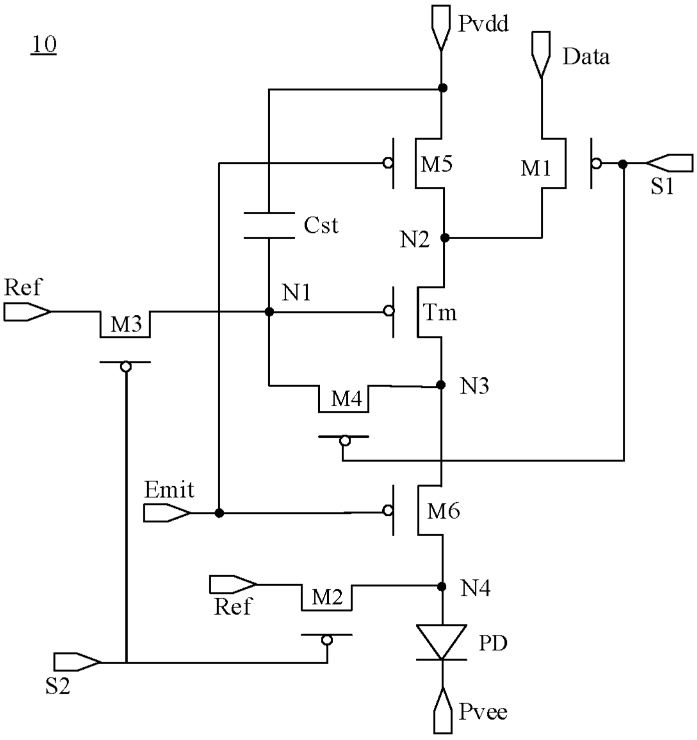
FIG. 1 is a schematic diagram of a pixel circuit in a display panel according to an embodiment of the present disclosure.

Embodiments of the present disclosure provide a display panel. The display panel includes pixels. Each pixel includes a light-emitting element and a pixel circuit, and the light-emitting element is electrically connected to the pixel circuit. The light-emitting element may be an organic light-emitting element or an inorganic light-emitting element. FIG. 1 is a schematic diagram of a pixel circuit in a display panel according to an embodiment of the present disclosure. As shown in FIG. 1, the pixel circuit 10 includes a drive transistor Tm, a data writing transistor M1, an electrode reset transistor M2, a gate reset transistor M3, a threshold compensation transistor M4, a first light-emitting control transistor M5, and a second light-emitting control transistor M6. The drive transistor Tm is connected in series between the first light-emitting control transistor M5 and the second light-emitting control transistor M6. The drive transistor Tm includes a gate connected to a first node N1, a first electrode connected to a second node N2, and a second electrode connected to a third node N3. The gate reset transistor M3 is connected to the first node N1. The data writing transistor M1 and the first light-emitting control transistor M5 are connected to the second node N2. The threshold compensation transistor M4 is connected in series between the first node N1 and the third node N3. The second light-emitting control transistor M6 includes a first electrode connected to the third node N3 and a second electrode connected to a fourth node N4. The electrode reset transistor M2 is connected to the fourth node N4. The light-emitting element PD includes a first electrode connected to the fourth node N4 and a second electrode receiving a negative power signal Pvee. A gate of the data writing transistor M1 and a gate of the threshold compensation transistor M4 receive a scanning signal S1. A gate of the gate reset transistor M3 and a gate of the electrode reset transistor M2 receive a scanning signal S2. A gate of the first light-emitting control transistor M5 and a gate of the second light-emitting control transistor M6 receive a light-emitting control signal Emit. To drive the pixel circuit 10, scanning lines and a light-emitting control line are arranged in the display panel. The scanning lines provide the scanning signals, and the light-emitting control line provides the light-emitting control signal. Additionally, a reset signal line providing a reset signal Ref, a data line providing a data signal Data, and a positive power line providing a positive power signal Pvdd are arranged. A storage capacitor Cst in the pixel circuit 10 includes a first plate connected to the first node N1, and electrode second plate connected to the positive power signal Pvdd.

In FIG. 1, the transistors in the pixel circuit 10 are all p-type transistors. In other embodiments, the transistors in the pixel circuit 10 may all be n-type transistors.

In addition, in the embodiment shown in FIG. 1, the electrode reset transistor M2 and the gate reset transistor M3 receive the same reset signal Ref. In other embodiments, the gate reset transistor M3 receives a first reset signal, and the electrode reset transistor M2 receives a second reset signal. Voltage amplitudes of the first reset signal and second reset signal are different.

The display panel is further provided with a scan driving circuit and a light-emitting shift circuit. The scan driving circuit and the light-emitting shift circuit each include a plurality of cascaded shift registers. The cascaded shift registers in the scan driving circuit are configured to sequentially output scanning signals, and the cascaded shift registers in the light-emitting shift circuit are configured to sequentially output light-emitting control signals. In FIG. 1, the electrode reset transistor M2 and the gate reset transistor M3 receive the same scanning signal, and thus the electrode reset transistor M2 and the gate reset transistor M3 are connected to the same stage of shift register in the scan driving circuit. In other embodiments, the electrode reset transistor M2 and the gate reset transistor M3 are respectively connected to adjacent two stages of shift registers in the scan driving circuit, and thus the electrode reset transistor M2 and the gate reset transistor M3 respectively receive scanning signals sequentially outputted by the adjacent two stages of shift registers.

Figure 2:
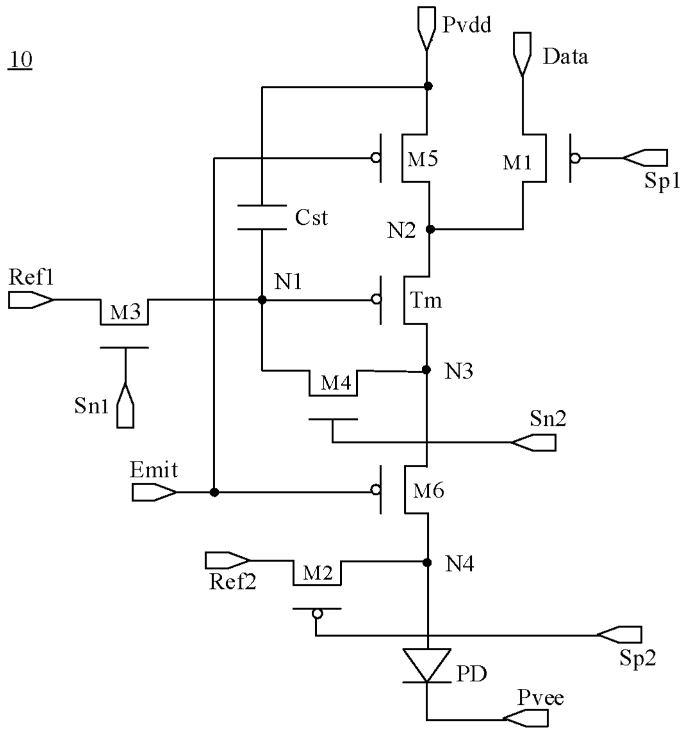
FIG. 2 is a schematic diagram of a pixel circuit in another display panel according to an embodiment of the present disclosure.

FIG. 2 is a schematic diagram of a pixel circuit in another display panel. In some embodiments, as shown in FIG. 2, the gate reset transistor M3 and the threshold compensation transistor M4 in the pixel circuit 10 are n-type transistors, and other transistors are p-type transistors. An active layer of the gate reset transistor M3 and an active layer of the threshold compensation transistor M4 include metal oxide, such as indium gallium zinc oxide, while active layers of the other transistors include silicon. In this way, the leakage current of the gate reset transistor M3 and the threshold compensation transistor M4 in an off state is reduced, which can reduce the leakage current from the gate reset transistor M3 and the threshold compensation transistor M4 to the first node N1, thereby stabilizing the potential of the first node N1, and alleviating the problems of low frequency and sunlight-induced screen flickering. In addition, FIG. 2 shows that the gate reset transistor M3 receives a first reset signal Ref1, and the electrode reset transistor M2 receives a second reset signal Ref2. Voltage amplitudes of the first reset signal Ref1 and the second reset signal Ref2 are different. The gate of the data writing transistor M1 receives a scanning signal Sp1, the gate of the threshold compensation transistor M4 receives a scanning signal Sn2, the gate of the gate reset transistor M3 receives a scanning signal Sn1, and the gate of the electrode reset transistor M2 receives a scanning signal Sp2. The scanning signal Sn1 and the scanning signal Sn2 are provided by two adjacent stages of shift registers in a shift driving circuit, while the scanning signal Sp1 and the scanning signal Sp2 are provided by two adjacent stages of shift registers in another shift driving circuit.

In other embodiments, in the pixel circuit 10, the gate reset transistor M3 is an n-type transistor, and the other transistors are p-type transistors, or the threshold compensation transistor M4 is an n-type transistor, and the other transistors are p-type transistors, which is not illustrated in the figure herein.

The pixel circuits 10 in the display panel are arranged in an array of rows and columns, with multiple pixel circuits 10 arranged in a row direction to form pixel circuit rows, and multiple pixel circuits 10 arranged in a column direction to form pixel circuit columns. A scanning line is connected to multiple pixel circuits 10 arranged in the row direction, and the load on the scanning line is large, causing a significant voltage drop and affecting the display uniformity.

To improve the display uniformity, another embodiment of the present disclosure provides a display panel. In the pixel circuit of the display panel, the gate of a transistor and a gating line that provide a signal to the gate are located in different layers. Furthermore, the sheet resistance of the layer where the gating line is located is lower than the sheet resistance of the layer where the corresponding gate is located, thereby reducing the voltage drop of the signal transmission through the gating line and improving the display uniformity.

Figure 3:
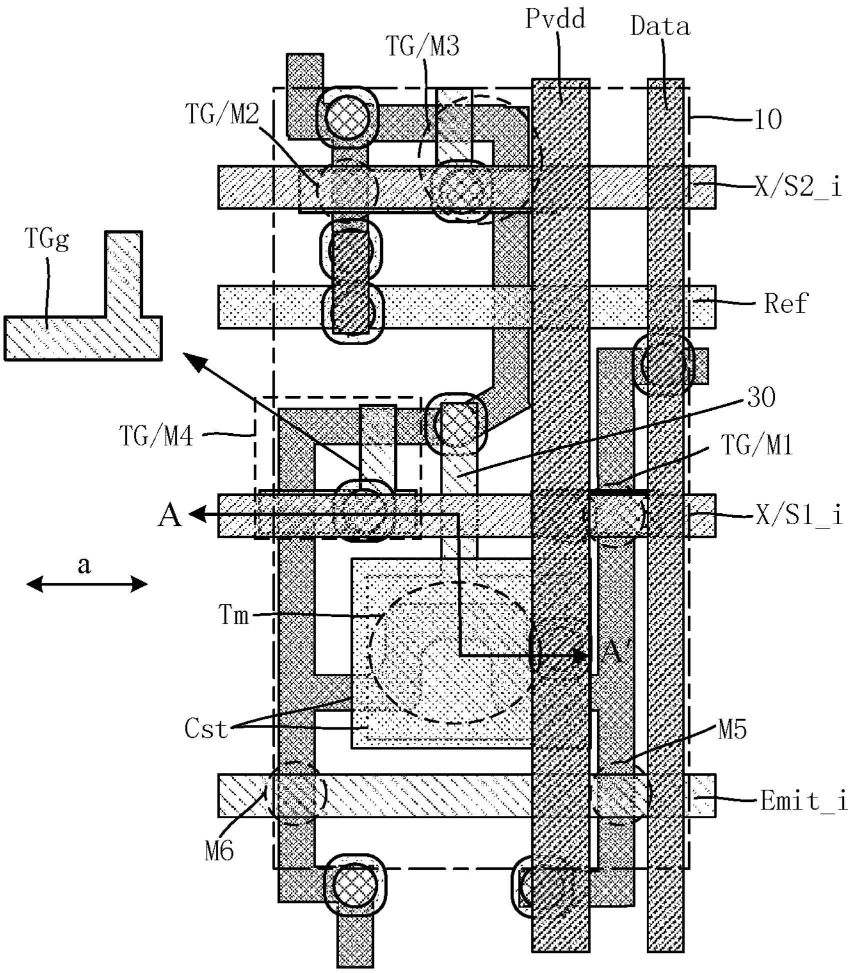
FIG. 3 is a schematic diagram of another display panel according to an embodiment of the present disclosure.
Figure 4:
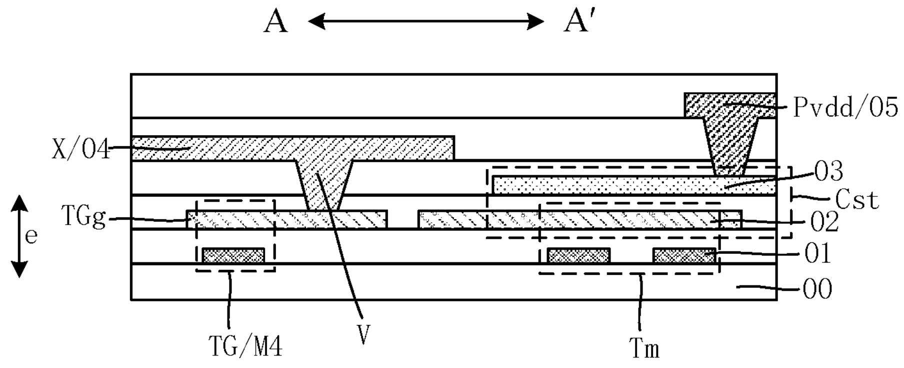
FIG. 4 is a schematic cross-sectional view taken along line A-A' shown in FIG. 3.

FIG. 3 is a schematic diagram of another display panel according to an embodiment of the present disclosure. FIG. 4 is a schematic cross-sectional view taken along line A-A' shown in FIG. 3. FIG. 3 shows some signal lines and a pixel circuit 10 in the i-th pixel circuit row in the display panel, where i is an integer greater than or equal to 2. For the transistors in the pixel circuit 10 and the connection between the transistors, reference can be made to the embodiment shown in FIG. 1. In some embodiments, as shown in FIG. 3, the gate of the data writing transistor M1 and the gate of the threshold compensation transistor M4 are connected to a scanning line S1_*i*. The gate of the electrode reset transistor M2 and the gate of the gate reset transistor M3 are connected to a scanning line S2_*i*. The gate of the first light-emitting control transistor M5 and the gate of the second light-emitting control transistor M6 are connected to a light-emitting control line Emit_i. After the electrode reset transistor M2, which is connected to the scanning line S2_*i*, is turned on, light-emitting elements connected to the pixel circuits 10 in the (i−1)-th pixel circuit row are reset. The scanning line S1_*i* and the scanning line S2_*i* are connected to two adjacent stages of shift registers in the same shift driving circuit. In addition, FIG. 3 also shows a positive power line Pvdd and a data line Data. The positive power line Pvdd is labeled with the same symbol as the positive power signal Pvdd, and the data line Data is labeled with the same symbol as the data signal Data. The reset signal line Ref provides the reset signal Ref.

As shown in FIG. 3, the gating line X extends in a first direction a. The pixel circuit 10 includes a functional transistor TG. The functional transistor TG includes a patterned conductive structure TGg. The gate of the functional transistor TG is located in the conductive structure TGg. The patterned conductive structure TGg is an isolated island-like structure in the layer where it is located. For example, the conductive structures TGg in the functional transistors TG with the same function in two adjacent pixel circuits are not in direct contact with each other. The sheet resistance of the layer where the gating line X is located is lower than the sheet resistance of the layer where the conductive structure TGg is located. As shown in FIG. 4, the gating line X and the functional transistor TG are located on one side of the substrate 00, and the conductive structure TGg is electrically connected to the gating line X through a via V. It can be understood that a transistor includes a gate and an active layer. The active layer includes a source region, a drain region, and a channel region. The channel region is located between the source region and the drain region. The gate overlaps with the channel region of the active layer.

In FIG. 3, the functional transistors TG include a data writing transistor M1, a threshold compensation transistor M4, an electrode reset transistor M2, and a gate reset transistor M3. In other embodiments, the functional transistors TG include one or more of the data writing transistor M1, the threshold compensation transistor M4, the electrode reset transistor M2, and the gate reset transistor M3, which is not illustrated in the figure herein.

In the related art, the gating line and the gate of the transistor connected to the gating line are usually located in the same layer, and a portion of the gating line is reused as the gate of the transistor. That is, the material of the gating line is the same as that of the gate of the transistor. In the embodiment of the present disclosure, the functional transistor TG includes the patterned conductive structure TGg, and the gate of the functional transistor TG is located in the conductive structure TGg. The conductive structure TGg is electrically connected to the gating line X through the via, and the sheet resistance of the layer where the gating line X is located is lower than the sheet resistance of the layer where the conductive structure TGg is located. This can reduce the resistance of the gating line X, thereby reducing the voltage drop during signal transmission through the gating line X. The conductive structure TGg in the embodiment of the present disclosure ensures the performance of the functional transistor TG, while also reducing the voltage drop during signal transmission through the gating line X and improving the display uniformity.

In some embodiments, as shown in FIG. 4, the display panel further includes a first semiconductor layer 01, a gate metal layer 02, a capacitor metal layer 03, a first metal layer 04, and a second metal layer 05 that are all located on one side of the substrate 00. The first semiconductor layer 01, the gate metal layer 02, the capacitor metal layer 03, the first metal layer 04, and the second metal layer 05 are sequentially located in a direction away from the substrate 00. The active layer of the functional transistor TG is located in the first semiconductor layer 01, and the conductive structure TGg of the functional transistor TG is located in the gate metal layer 02. The gating line X is located in the first metal layer 04. The active layer of the drive transistor Tm is located in the first semiconductor layer 01, and the gate of the drive transistor Tm is located in the gate metal layer 02. The gate of the drive transistor Tm is reused as one electrode of the storage capacitor Cst, and the other electrode of the storage capacitor Cst is located in the capacitor metal layer 03. The positive power line Pvdd is located in the second metal layer 05, and the electrode of the storage capacitor Cst located in the capacitor metal layer 03 is connected to the positive power line Pvdd through a via.

In some embodiments, the material of the gate metal layer 02 includes molybdenum, the material of the first metal layer 04 includes aluminum and titanium, the material of the gating line X includes aluminum and titanium, and the material of the conductive structure TGg includes molybdenum. The first metal layer 04 is a stack structure including a titanium layer/an aluminum layer/a titanium layer. In some embodiments, the material of the capacitor metal layer 03 is the same as the material of the gate metal layer 02, and the material of the second metal layer 05 is the same as the material of the first metal layer 04.

Figure 5:
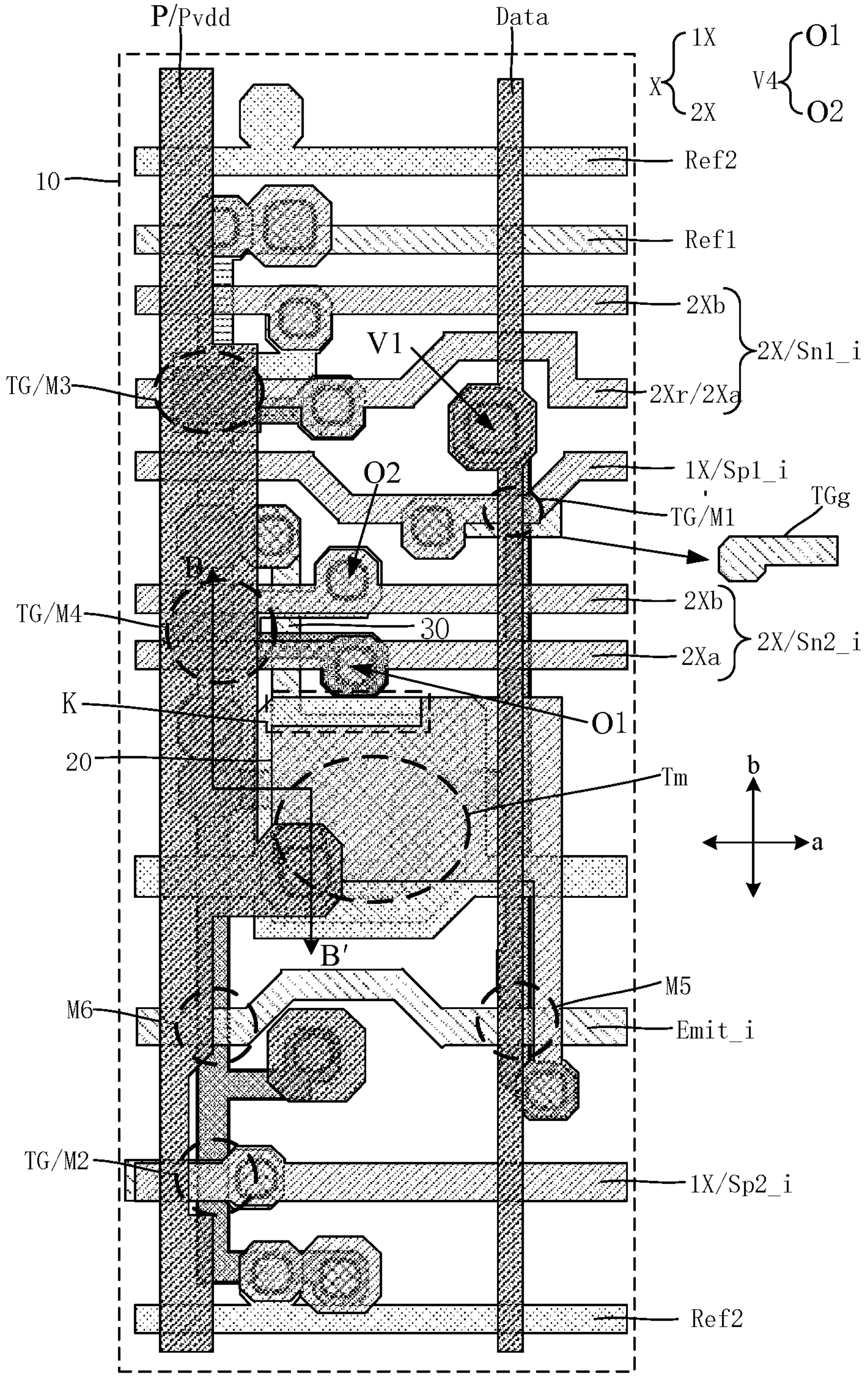
FIG. 5 is a schematic diagram of another display panel according to an embodiment of the present disclosure.

FIG. 5 is a schematic diagram of another display panel according to an embodiment of the present disclosure. FIG. 5 shows some signal lines and a pixel circuit 10 in the i-th pixel circuit row in the display panel, where i is an integer greater than or equal to 2. For the transistors in the pixel circuit 10 and the connection between the transistors, reference can be made to the embodiment shown in FIG. 2. In some embodiments, as shown in FIG. 5, the gate of the data writing transistor M1 is electrically connected to a scanning line Sp1_*i*, the gate of the electrode reset transistor M2 is electrically connected to a scanning line Sp2_*i*, the gate of the gate reset transistor M3 is electrically connected to a scanning line Sn1_*i*, and the gate of the threshold compensation transistor M4 is electrically connected to a scanning line Sn2_*i*. The gate of the first light-emitting control transistor M5 and the gate of the second light-emitting control transistor M6 are electrically connected to a light-emitting control line Emit_i. The scanning line Sp1_*i* and the scanning line Sp2_*i* are respectively connected to two adjacent stages of shift registers in the same shift driving circuit. The scanning line Sn1_*i* and the scanning line Sn2_*i* are respectively connected to two adjacent stages of shift registers in the same shift driving circuit. FIG. 5 also shows a positive power line Pvdd and a data line Data. The positive power line Pvdd is labeled with the same symbol as the positive power signal Pvdd, and the data line Data is labeled with the same symbol as the data signal Data.

As shown in FIG. 5, the gating line X extends in a first direction a. The pixel circuit 10 includes a functional transistor TG. The functional transistor TG includes a patterned conductive structure TGg. The gate of the functional transistor TG is located in the conductive structure TGg. In FIG. 5, the functional transistor TG includes a gate reset transistor M3, a threshold compensation transistor M4, a data writing transistor M1, and an electrode reset transistor M2. The small picture on the right side of FIG. 5 shows the conductive structure TGg of the data writing transistor M1. The sheet resistance of the layer where the gating line X is located is lower than the sheet resistance of the layer where the conductive structure TGg is located. The conductive structure TGg is electrically connected to the gating line X through a via in an insulation layer.

In the embodiment of the present disclosure, the functional transistor TG includes the patterned conductive structure TGg. The conductive structure TGg is electrically connected to the gating line X through the via, and the sheet resistance of the layer where the gating line X is located is lower than the sheet resistance of the layer where the conductive structure TGg is located. This can reduce the resistance of the gating line X, thereby reducing the voltage drop during signal transmission through the gating line X. The conductive structure TGg ensures the performance of the functional transistor TG. Meanwhile, the gating line X made of the layer with the lower sheet resistance can reduce the voltage drop during signal transmission through the gating line X and improve the display uniformity.

In some embodiments, referring to FIG. 3 and FIG. 4, in a direction e perpendicular to a plane where the substrate 00 is located, the gate of the functional transistor TG at least partially overlaps with the connected gating line X. The gate of the functional transistor TG is the part of the conductive structure TGg that overlaps with the active layer. This design can save wiring space in the display panel. The direction e is the thickness direction of the substrate 00.

As shown in FIG. 4, the conductive structure TGg is located in the gate metal layer 02, and the gating line X is located in the first metal layer 04. In the direction e perpendicular to the plane where the substrate 00 is located, the insulation layer between the gate metal layer 02 and the first metal layer 04 is relatively thin. In some embodiments, in the direction e perpendicular to the plane where the substrate 00 is located, the gating line X is covers the conductive structure TGg connected thereto. This design can avoid the unevenness caused by the gating line X formed above the conductive structure TGg.

In other embodiments, in the direction e perpendicular to the plane where the substrate 00 is located, at least part of the conductive structure TGg does not overlap with the gating line X connected thereto. In other words, the conductive structure TGg and the gating line X connected to the conductive structure TGg are staggered, which can reduce the transmittance of the display panel.

In some embodiments, the pixel circuit 10 includes a first transistor, and an active layer of the first transistor includes silicon. All transistors in the pixel circuit 10 are first transistors, and the functional transistor TG includes at least one first transistor. In the embodiment shown in FIG. 3, the functional transistor TG includes four first transistors: a data writing transistor M1, a threshold compensation transistor M4, an electrode reset transistor M2, and a gate reset transistor M3. In other embodiments, the functional transistor TG includes one, two or three of the data writing transistor M1, the threshold compensation transistor M4, the electrode reset transistor M2, and the gate reset transistor M3.

Figure 6:
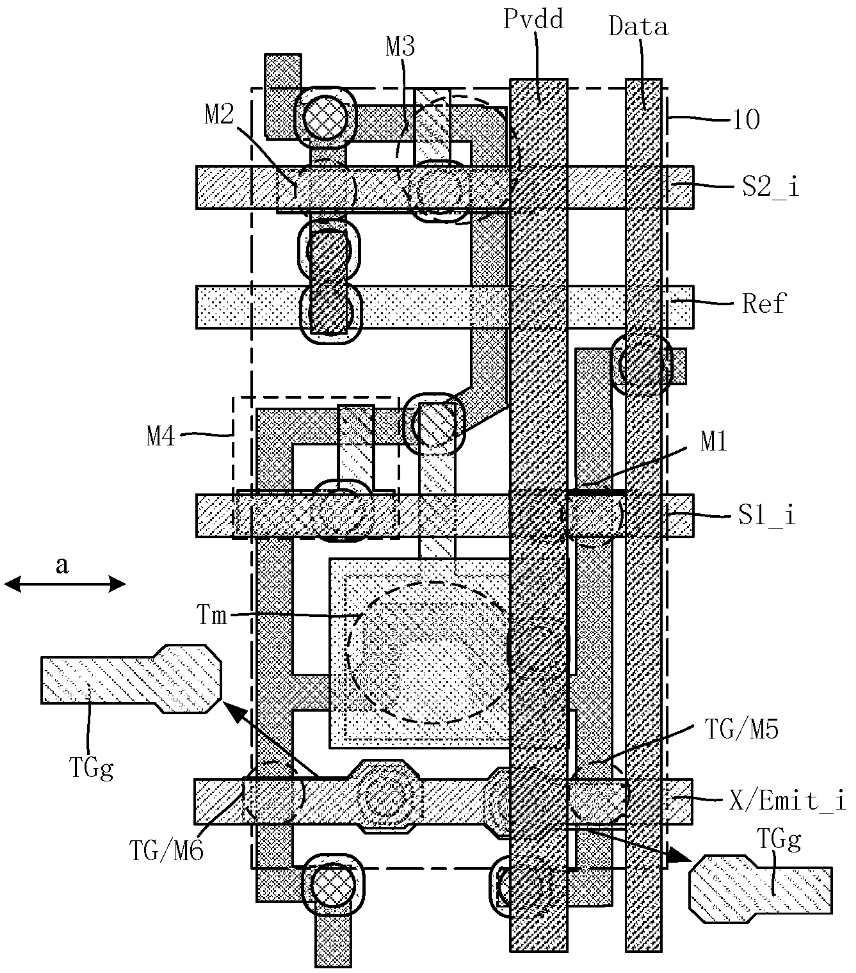
FIG. 6 is a schematic diagram of another display panel according to an embodiment of the present disclosure.

FIG. 6 is a schematic diagram of another display panel according to an embodiment of the present disclosure. In some embodiments, as shown in FIG. 6, the functional transistor TG further includes a first light-emitting control transistor M5 and a second light-emitting control transistor M6, and the gating line X includes a light-emitting control line. That is, the first light-emitting control transistor M5 and the second light-emitting control transistor M6 each include a conductive structure TGg, and the conductive structure TGg is connected to a light-emitting control line Emit_i through a via.

In other embodiments, the pixel circuit 10 includes a first transistor and a second transistor. The active layer of the first transistor includes silicon, and the active layer of the second transistor includes metal oxide. The functional transistor includes at least one first transistor and at least one second transistor. In the embodiment shown in FIG. 5, the threshold compensation transistor M4 and gate reset transistor M3 are the second transistors, while other transistors are the first transistors. In the embodiment shown in FIG. 5, the functional transistor TG includes a data writing transistor M1, a threshold compensation transistor M4, an electrode reset transistor M2, and a gate reset transistor M3. That is, the functional transistor TG includes two first transistors and two second transistors.

In other embodiments, the functional transistor TG includes at least one of the data writing transistor M1, the threshold compensation transistor M4, the gate reset transistor M3, and the electrode reset transistor M2. The active layers of the data writing transistor M1 and the electrode reset transistor M2 include silicon. The active layers of the threshold compensation transistor M4 and the gate reset transistor M3 include metal oxide, which is not illustrated in the figure herein.

Figure 7:
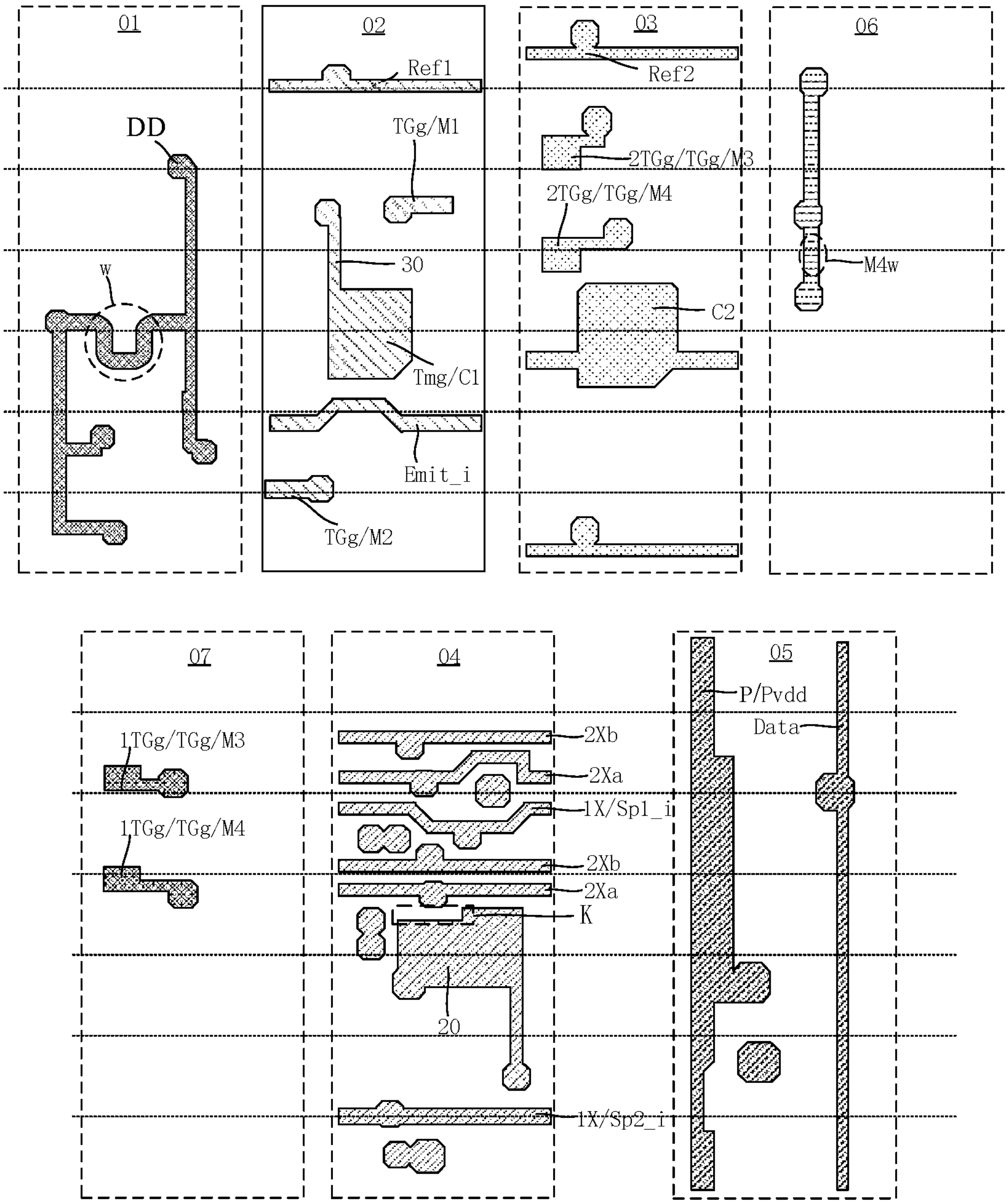
FIG. 7 is an exploded view of layers of the pixel circuit in FIG. 5.

FIG. 7 is an exploded view of layers at the pixel circuit in FIG. 5. The pixel circuit shown in FIG. 5 can be understood with reference to FIG. 7. As shown in FIG. 7, the display panel includes a first semiconductor layer 01, a gate metal layer 02, a capacitor metal layer 03, a first metal layer 04, a second metal layer 05, a second semiconductor layer 06, and a second gate metal layer 07 that are all located on one side of the substrate 00. The first semiconductor layer 01, the gate metal layer 02, the capacitor metal layer 03, the second semiconductor layer 06, the second gate metal layer 07, the first metal layer 04, and the second metal layer 05 are sequentially located in a direction away from the substrate 00. The gate reset transistor M3 and the threshold compensation transistor M4 are n-type transistors, while all the other transistors are p-type transistors. The active layers of the gate reset transistor M3 and the threshold compensation transistor M4 are located in the second semiconductor layer 06, while the active layers of the other transistors are located in the first semiconductor layer 01.

In the embodiment shown in FIG. 5, the first transistor includes a data writing transistor M1, an electrode reset transistor M2, a first light-emitting control transistor M5, and a second light-emitting control transistor M6. The second transistor includes a threshold compensation transistor M4 and a gate reset transistor M3. The functional transistor TG includes the data writing transistor M1, the electrode reset transistor M2, the threshold compensation transistor M4, and the gate reset transistor M3. FIG. 5 shows the patterned conductive structure TGg of the data writing transistor M1. The gating line X includes a first gating line 1X and a second gating line 2X. The conductive structure of the first transistor is electrically connected to the first gating line 1X through a via, and the conductive structure of the second transistor is electrically connected to the second gating line 2X through a via. The first gating line 1X and the second gating line 2X are located in the same layer. Referring to FIG. 7, both the first gating line 1X and the second gating line 2X are located in the first metal layer 04. In the embodiment of the present disclosure, the functional transistor TG includes two types of transistors: the first transistor and the second transistor. The first gating line 1X is connected to the conductive structure of the first transistor, and the second gating line 2X is connected to the conductive structure of the second transistor. The first gating line 1X and the second gating line 2X extend in the same direction and are located in the same layer, such that the first gating line 1X and the second gating line 2X can be manufactured in the same step, simplifying the manufacturing process.

Figure 8:
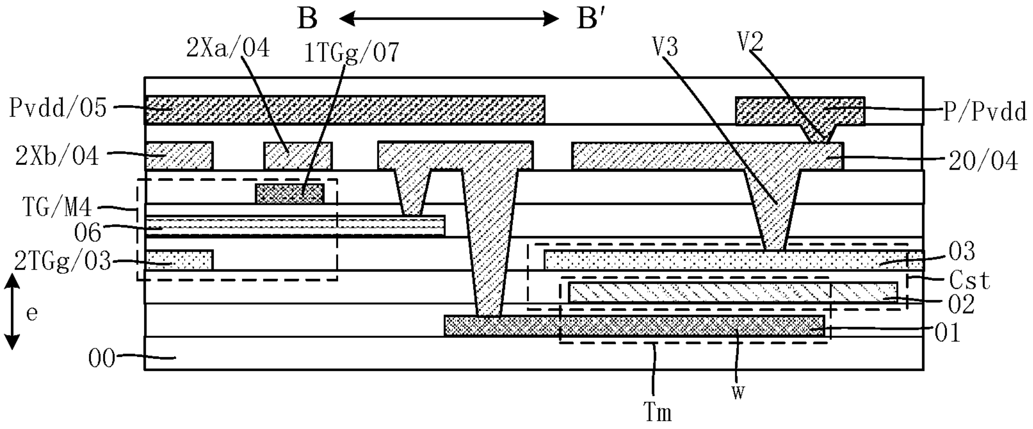
FIG. 8 is a schematic cross-sectional view taken along line B-B' shown in FIG. 5.

In some embodiments, as shown in FIG. 5 and FIG. 7, the second transistor includes a threshold compensation transistor M4 and a gate reset transistor M3. The threshold compensation transistor M4 is taken as an example for illustration. FIG. 8 is a schematic cross-sectional view taken along line B-B' in FIG. 5. As shown in FIG. 8, the conductive structure of the threshold compensation transistor M4 includes a first conductive structure 1TGg and a second conductive structure 2TGg. The threshold compensation transistor M4 has a first gate located in the first conductive structure 1TGg and a second gate located in the second conductive structure 2TGg. An active layer of the threshold compensation transistor M4 (i.e., the second transistor) is located in the second semiconductor layer 06. In the direction e perpendicular to the plane where the substrate 00 is located, the first conductive structure 1TGg and the second conductive structure 2TGg are located at two sides of the active layer of the threshold compensation transistor M4 (i.e., the second transistor) respectively. Referring to FIG. 5, the second gating line 2X includes a first gating sub-line 2Xa and a second gating sub-line 2Xb. The first conductive structure 1TGg is electrically connected to the first gating sub-line 2Xa through a via O1, and the second conductive structure 2TGg is electrically connected to the second gating sub-line 2Xb through a via O2. Additionally, as shown in FIG. 7, the conductive structure of the gate reset transistor M3 includes a first conductive structure 1TGg and a second conductive structure 2TGg. The first conductive structure 1TGg of the gate reset transistor M3 and the first conductive structure 1TGg of the threshold compensation transistor M4 are located in the same layer, and the second conductive structure 2TGg of the gate reset transistor M3 and the second conductive structure 2TGg of the threshold compensation transistor M4 are located in the same layer. In this embodiment, the second transistor is a dual-gate transistor, which can improve the performance of the second transistor. Furthermore, for the second transistor, two gating sub-lines are arranged to be connected to the two conductive structures respectively, which can further reduce the voltage drop during signal transmission through the second gating line 2X, thereby improving the display uniformity.

In some embodiments, as shown in FIG. 5, the second transistor includes a threshold compensation transistor M4 and a gate reset transistor M3. The threshold compensation transistor M4 includes a first conductive structure 1TGg and a second conductive structure 2TGg, and the gate reset transistor M3 includes a first conductive structure 1TGg and a second conductive structure 2TGg. For the second transistor, the via between the first conductive structure 1TGg and the first gating sub-line 2Xa, and the via between the second conductive structure 2TGg and the second gating sub-line 2Xb are located on the same side of the active layer of the second transistor. The active layer of the second transistor is located in the second semiconductor layer 06 (as shown in FIG. 7). In this embodiment, the second transistor is a dual-gate transistor, which can improve the performance of the second transistor. Moreover, the two vias connecting the two conductive structures of the second transistor to the gating lines X on the same side of the active layer. In this way, the width of the second transistor in the first direction a is reduced, thereby saving space and making the layout of the pixel circuit more compact.

In some embodiments, as shown in FIG. 7 and FIG. 8, a first electrode C1 of the storage capacitor Cst and the gate of the drive transistor Tm are located in the same layer, and a second electrode C2 of the storage capacitor Cst is located on a side of the first electrode C1 away from the substrate 00. For the threshold compensation transistor M4, the first conductive structure 1TGg of the threshold compensation transistor M4 is located on a side of the second electrode C2 away from the substrate 00, while the second conductive structure 2TGg is located in the same layer as the second electrode C2.

As shown in FIG. 5, the threshold compensation transistor M4 is a first sub-transistor of the second transistor. Referring to FIG. 7, for the first conductive structure 1TGg and the second conductive structure 2TGg of the threshold compensation transistor M4, in a second direction b, the first conductive structure 1TGg is located between the second conductive structure 2TGg and the second electrode C2 of the storage capacitor Cst. The second direction b intersects with the first direction a and is parallel to the plane where the substrate 00 is located. Referring to FIG. 7, the second conductive structure 2TGg of the threshold compensation transistor M4 and the second electrode C2 of the storage capacitor Cst are both located in the capacitor metal layer 03. The first conductive structure 1TGg is arranged between the second conductive structure 2TGg and the second electrode C2 of the storage capacitor Cst in the planar wiring layout of the pixel circuit 10. In this way, the distance between the first conductive structure 1TGg and the second electrode C2 in the second direction b can be relatively small, which can save the wiring space of the pixel circuit 10 in the second direction b.

In some embodiments, referring to FIG. 5, FIG. 7, and FIG. 8, the display panel further includes a cover portion 20, which is located on a side of the drive transistor Tm away from the substrate 00. In the direction e perpendicular to the plane where the substrate 00 is located, the cover portion 20 overlaps with the active layer w of the drive transistor Tm, and FIG. 7 shows that the active layer w of the drive transistor Tm is located in the first semiconductor layer 01. The cover portion 20 overlaps with and covers the active layer w of the drive transistor Tm. The cover portion 20 is made of a metal material and thus has a certain light-blocking capability. The cover portion 20 can block light from reaching the active layer w of the drive transistor Tm, thereby ensuring the stable characteristics of the drive transistor Tm and the display effect. In the second direction b, the cover portion 20 is adjacent to the first gating sub-line 2Xa, the cover portion 20 is provided with a notch K at an end close to the first gating sub-line 2Xa, and the notch K partially surrounds the via O1 between the first conductive structure 1TGg and the first gating sub-line 2Xa. The cover portion 20 is provided with the notch K. When the cover portion 20 and the gating line X are made in the same layer, a safe distance between the cover portion 20 and the first gating sub-line 2Xa can be ensured.

In some embodiments, referring to FIG. 5 and FIG. 7, the display panel includes data lines Data for transmitting data signals, and the pixel circuit includes a data receiving terminal DD. The data writing transistor M1 is connected to the data receiving terminal DD. The data receiving terminal DD is located in the same layer as the active layer of the first transistor, i.e. the data receiving terminal DD is located in the first semiconductor layer 01. The data receiving terminal DD is connected to the data line Data through a first via V1.

The second transistor includes a second sub-transistor. The second sub-transistor includes a conductive structure TGg. The second gating line 2X includes a detour gating line, which is electrically connected to the conductive structure TGg of the second sub-transistor. In FIG. 5, the gate reset transistor M3 is the second sub-transistor in the second transistor, and the first gating sub-line 2Xa in the second gating line 2X is the detour gating line 2Xr. The detour gating line 2Xr is electrically connected to the first conductive structure 1TGg of the gate reset transistor M3. The detour gating line 2Xr bypasses the first via V1 by extending, on one side of the first via V1, around half of the first via V1.

As shown in FIG. 7, the data receiving terminal DD is located in the first semiconductor layer 01, and the data line Data is located in the second metal layer 05. The data line Data and the data receiving terminal DD are spaced apart by multiple conductive layers, and the insulation layer between the data line Data and the data receiving terminal DD is relatively thick. Therefore, the first via V1 has a relatively large depth. In order to ensure the connectivity performance between the data line Data and the data receiving terminal DD, the area of the first via V1 needs to meet certain requirements. The detour gating line 2Xr bypasses the first via V1 by extending around the first via V1, and the shape of the detour gating line 2Xr is designed to adapt to the position of the first via V1, which is conducive to the compact wiring and layout of the pixel circuit 10, and can save wiring space.

Figure 9:
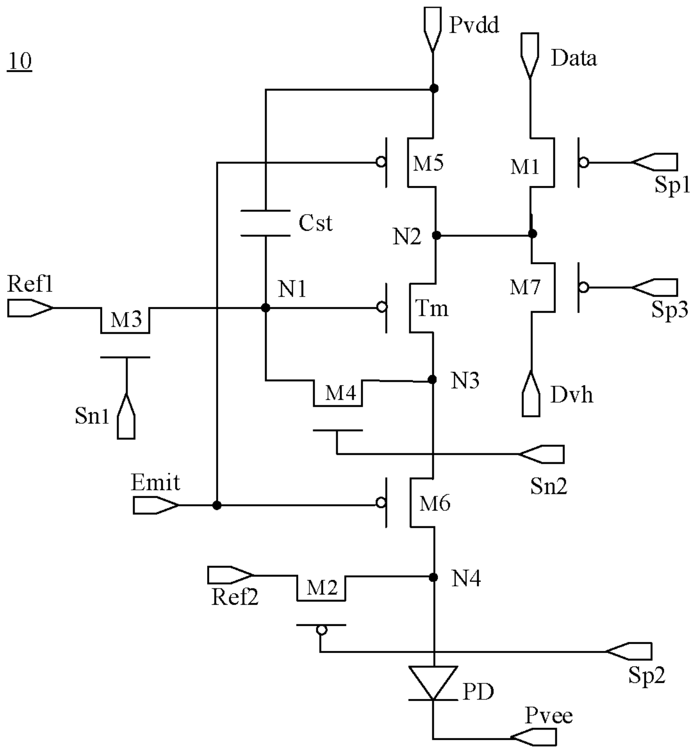
FIG. 9 is a schematic diagram of a pixel circuit in another display panel according to an embodiment of the present disclosure.

FIG. 9 is a schematic diagram of a pixel circuit in another display panel according to an embodiment of the present disclosure. In some embodiments, as shown in FIG. 9, the pixel circuit 10 includes a bias transistor M7, which is configured to adjust a bias state of the drive transistor Tm. The bias transistor M7 is connected to the second node N2. The gate of the bias transistor M7 receives a scanning signal Sp3, a first terminal of the bias transistor M7 receives a bias signal Dvh, and a second terminal of the bias transistor M7 is connected to the second node N2. The bias transistor M7 is a p-type transistor. The embodiment shown in FIG. 9 can be understood with reference to FIG. 2. In the embodiment shown in FIG. 9, the gate reset transistor M3 and the threshold compensation transistor M4 are n-type transistors, and the other transistors are p-type transistors. The bias transistor M7 can adjust the bias state of the drive transistor Tm, to alleviate the threshold voltage drift of the drive transistor Tm, thereby improving the display effect.

In other embodiments, the bias transistor M7 is connected to the third node N3, which is not illustrated in the figure herein.

Figure 10:
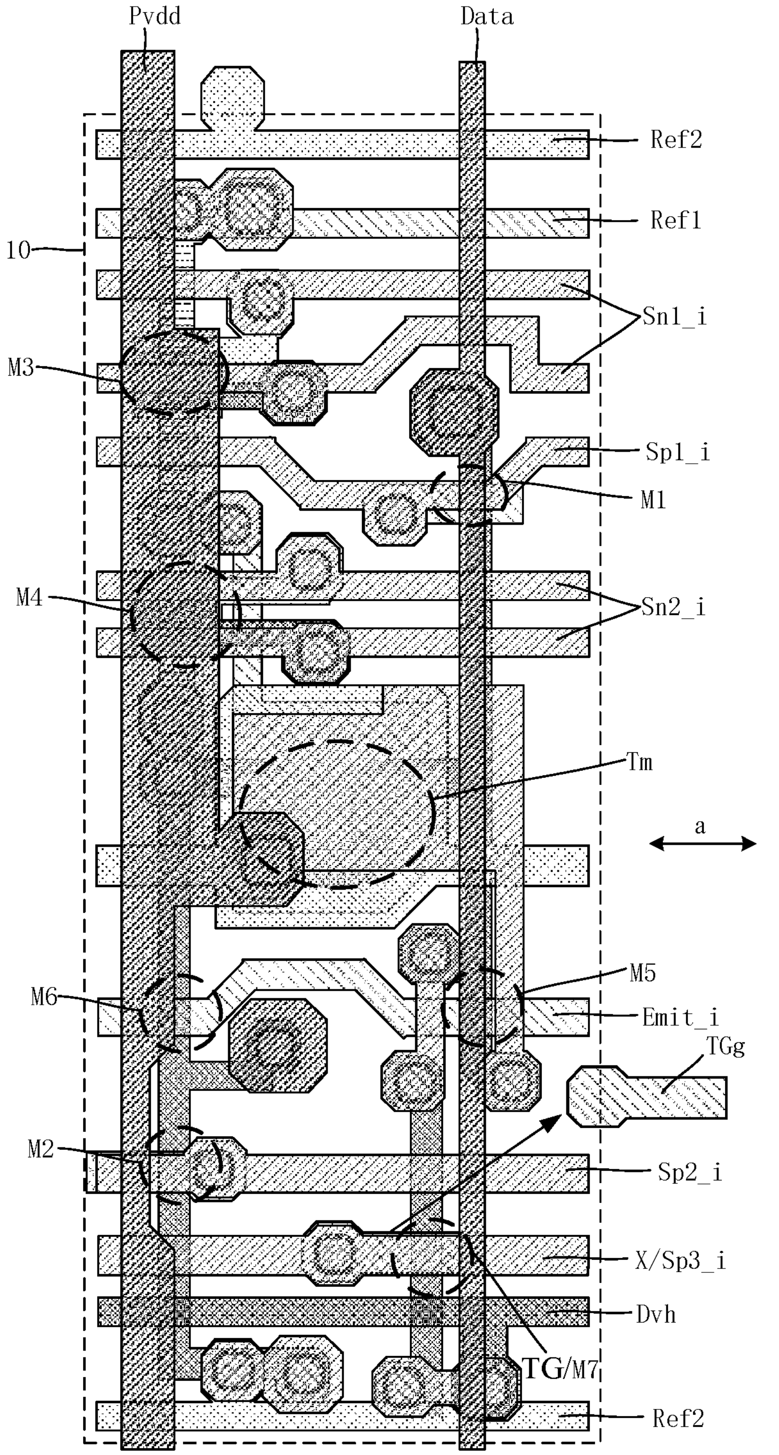
FIG. 10 is a schematic diagram of another display panel according to an embodiment of the present disclosure.

In some embodiments, the bias transistor M7 includes a conductive structure, that is, the first transistor includes the bias transistor M7. FIG. 10 is a schematic diagram of another display panel according to an embodiment of the present disclosure. FIG. 10 shows some signal lines and a pixel circuit 10 in the i-th pixel circuit row in the display panel. For the transistors in the pixel circuit 10 and the connection between the transistors, reference can be made to the embodiment shown in FIG. 9. As shown in FIG. 10, the display panel includes a scanning line Sp3_*i* and a bias signal line Dvh extending in the first direction a (the bias signal line Dvh and the bias signal Dvh are labeled with the same reference sign), and the bias signal line Dvh provides the bias signal Dvh to the bias transistor M7. The bias transistor M7 includes a conductive structure TGg. The conductive structure TGg is electrically connected to the gating line X through a via. With reference to the film layer structure in the embodiment shown in FIG. 8, the bias transistor M7 includes an active layer located in the first semiconductor layer 01 and a conductive structure TGg located in the gate metal layer 02. The gating line X electrically connected to the conductive structure TGg of the bias transistor M7 is located in the first metal layer 04. The sheet resistance of the first metal layer 04 is lower than the sheet resistance of the gate metal layer 02. In this embodiment, the bias transistor M7 is provided to adjust the bias state of the drive transistor Tm, which alleviates the threshold voltage drift of the drive transistor Tm and improves the display effect. Meanwhile, the bias transistor M7 includes a conductive structure TGg, and the sheet resistance of the layer where the scanning line Sp3_*i* is located is lower than the sheet resistance of the layer where the conductive structure TGg is located, which can reduce the resistance of the scanning line Sp3_*i*, thereby reducing the voltage drop during signal transmission through the scanning line Sp3_*i*. This embodiment ensures the performance of the bias transistor M7 while reducing the voltage drop during signal transmission through the scanning line Sp3_*i* and improving the display uniformity.

Figure 11:
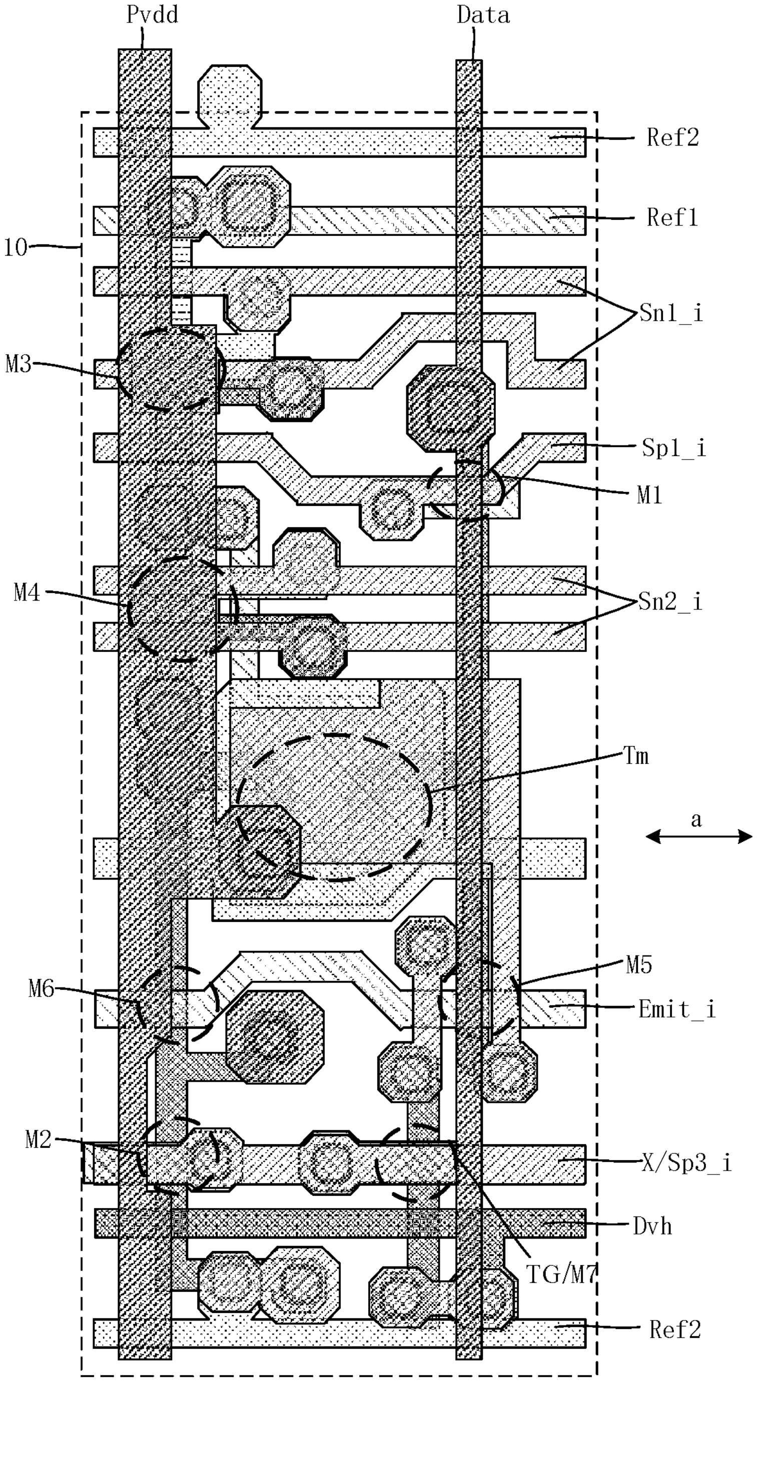
FIG. 11 is a schematic diagram of another display panel according to an embodiment of the present disclosure.

In other embodiments, the gate of the bias transistor M7 and the gate of the electrode reset transistor M2 in the same pixel circuit 10 receive the same signal. FIG. 11 is a schematic diagram of another display panel according to an embodiment of the present disclosure. As shown in FIG. 11, the functional transistors TG include a bias transistor M7 and an electrode reset transistor M2. The gate of the bias transistor M7 and the gate of the electrode reset transistor M2 both receive the scanning signal provided by the scanning line Sp3. The conductive structure of the bias transistor M7 and the conductive structure of the electrode reset transistor M2 are connected to the same gating line X. This design can reduce the number of gating lines X arranged in the display panel, thus saving wiring space of the display panel.

Figure 12:
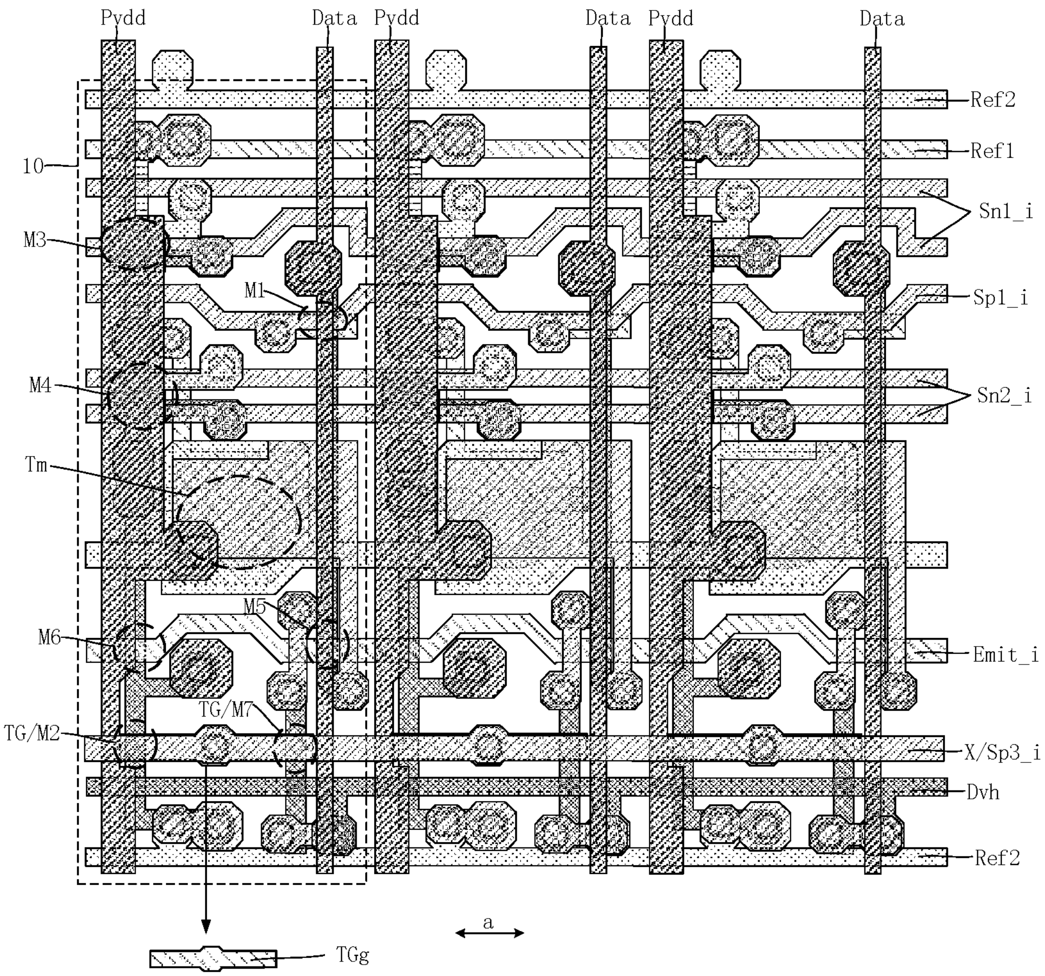
FIG. 12 is a schematic diagram of another display panel according to an embodiment of the present disclosure.

FIG. 12 is a schematic diagram of another display panel according to an embodiment of the present disclosure. FIG. 12 shows three pixel circuits 10 arranged in the first direction a in the i-th pixel circuit row. In some embodiments, as shown in FIG. 12, the functional transistor TG includes a bias transistor M7 and an electrode reset transistor M2. The conductive structure TGg of the bias transistor M7 and the conductive structure TGg of the electrode reset transistor M2 are connected to the same gating line X. In one pixel circuit 10, the conductive structure TGg of the bias transistor M7 and the conductive structure TGg of the electrode reset transistor M2 are formed in one piece. In other words, the bias transistor M7 and the electrode reset transistor M2 in one pixel circuit 10 share the same conductive structure TGg. It can be seen from FIG. 12 that the shared conductive structure TGg of the bias transistors M7 and the electrode reset transistors M2 in adjacent pixel circuits 10 are isolated and discontinuous from each other, and signals are provided to the conductive structures TGg in the pixel circuits 10 through the gating lines X respectively.

In some embodiments, as shown in FIG. 12, the shared conductive structure TGg of the bias transistor M7 and the electrode reset transistor M2 is electrically connected to the gating line X through a via. This design can reduce the number of holes required in the display panel, which helps save the wiring space of the display panel.

In other embodiments, the display panel includes reset signal lines and auxiliary signal lines. The extending direction of the reset signal lines intersects with the extending direction of the auxiliary signal lines. The pixel circuit 10 is connected to the reset signal line, and the auxiliary signal line is electrically connected to the reset signal line at the intersection. The layer where the reset signal line is located is on a side, adjacent to the substrate 00, of the layer where the auxiliary signal line is located, and the layer where the auxiliary signal line is located is on a side, away from the substrate 00, of the layer where the gating line X is located. The reset signal lines are provided in the display panel. The reset signal line is configured to provide a reset signal to the pixel circuit 10, and the auxiliary signal line is arranged to intersect with and be electrically connected to the reset signal line. The reset signal lines cross the auxiliary signal lines in the display panel to form a grid pattern, which can reduce the voltage drop during transmission of the reset signals, improve the uniformity of the reset signals, and thus improve the display uniformity. Moreover, the layer where the auxiliary signal line is located is on a side, away from the substrate 00, of the layer where the gating line is located, such that the layer where the gating line X is located is closer to the substrate 00. This results in a shorter distance between the layer where the gating line X is located and the layer where the conductive structure TGg is located. Therefore, the depth and size of the via connecting the conductive structure TGg and the gating line X will not be excessively large, which improves the yield of the via connection between the conductive structure TGg and the gating line X and also reduces the area occupied by the via, thus avoiding interference with the wiring space in the display panel.

In the embodiment of the present disclosure, both the reset signal line and the auxiliary signal line are made of a metal layer. Compared with semiconductor materials, metal materials have lower resistance. The reset signal line and the auxiliary signal line made of metal materials can reduce the voltage drop during transmission of the reset signal, which improves the display uniformity.

In some embodiments, the sheet resistance of the layer where the auxiliary signal line is located is lower than the sheet resistance of the layer where the reset signal line is located. This design can significantly reduce the voltage drop during transmission of the reset signal and improve display uniformity.

Figure 13:
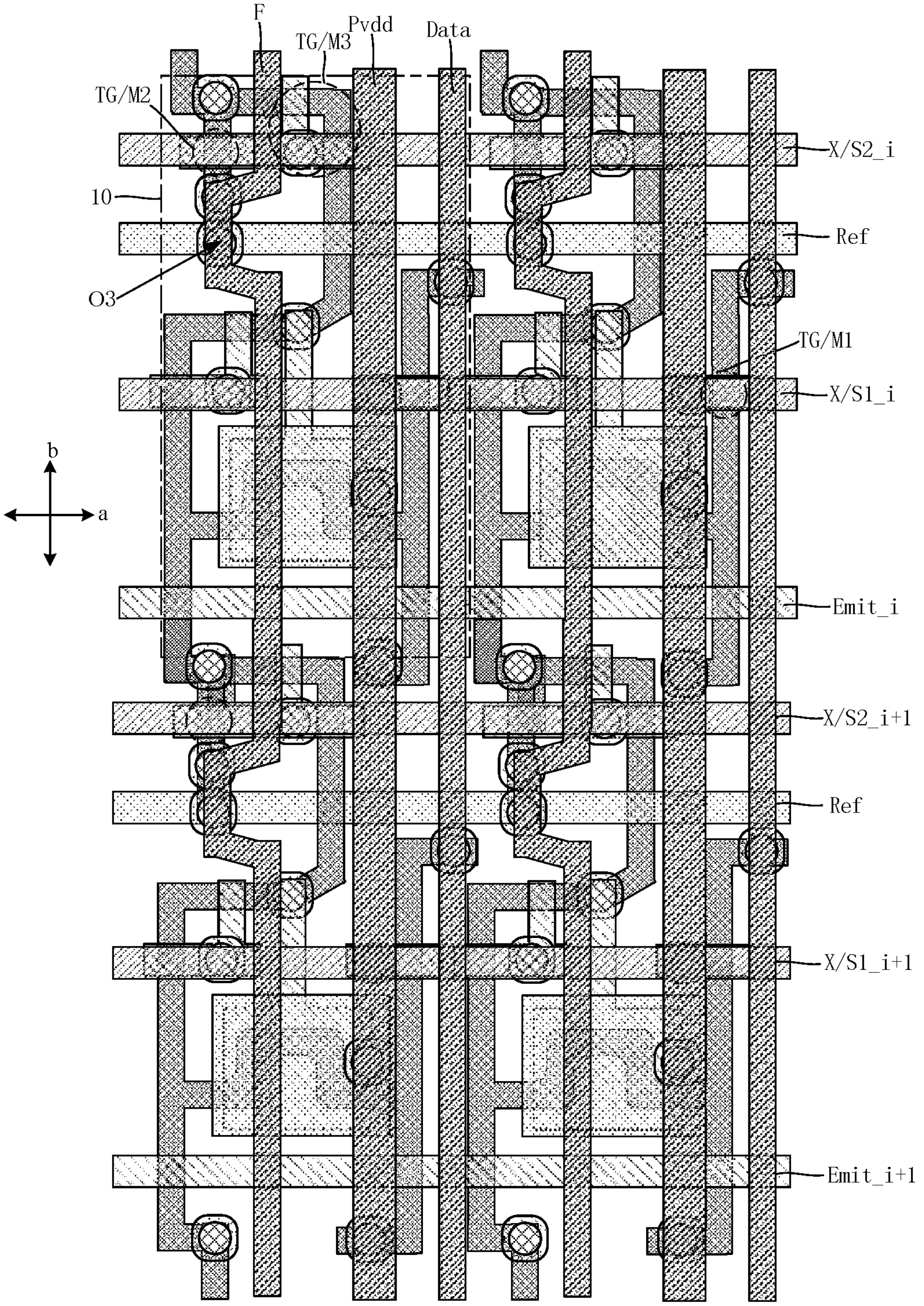
FIG. 13 is a schematic diagram of another display panel according to an embodiment of the present disclosure.

In some embodiments, reset signal lines and auxiliary signal lines are provided in the display panel. The electrode reset transistor M2 and the gate reset transistor M3 in the pixel circuit 10 receive the same reset signal. FIG. 13 is a schematic diagram of another display panel according to an embodiment of the present disclosure. The pixel circuit 10 in FIG. 13 can be understood with reference to the embodiment shown in FIG. 1, and not all transistors are shown with reference signs in FIG. 13. FIG. 13 shows two pixel circuits 10 in the i-th pixel circuit row and two pixel circuits 10 in the (i+1)-th pixel circuit row. The pixel circuit 10 in the i-th pixel circuit row is connected to a scanning line S1_*i*, a scanning line S2_*i*, and a light-emitting control line Emit_i. The pixel circuit 10 in the (i+1)-th pixel circuit row is connected to a scanning line S1_*i*+1, a scanning line S2_*i*+1, and a light-emitting control line Emit_i+1. As shown in FIG. 13, the display panel includes a reset signal line Ref extending in a first direction a and an auxiliary signal line F extending in a second direction b, with the second direction b intersecting with the first direction a. The auxiliary signal line F and the reset signal line Ref are electrically connected at the intersection. FIG. 13 shows a via 03 through which the auxiliary signal line F and the reset signal line Ref are electrically connected. The electrode reset transistor M2 and the gate reset transistor M3 are both connected to the reset signal line Ref. The layer where the reset signal line Ref is located is on a side, adjacent to the substrate 00, of the layer where the auxiliary signal line F is located, while the layer where the auxiliary signal line F is located is on a side, away from the substrate 00, of the layer where the gating line X is located.

With reference to the layer structure of the display panel of the embodiment shown in FIG. 4, the display panel includes a first semiconductor layer 01, a gate metal layer 02, a capacitor metal layer 03, a first metal layer 04, and a second metal layer 05 that are all located on one side of the substrate 00. In some embodiments, the gate metal layer 02 and the capacitor metal layer 03 can be made of the same material. The material of the gate metal layer 02 and the capacitor metal layer 03 includes molybdenum. The material of the first metal layer 04 and the second metal layer 05 includes titanium and/or aluminum. The sheet resistance of the gate metal layer 02 and the capacitor metal layer 03 is greater than the sheet resistance of the first metal layer 04 and the second metal layer 05. The first electrode of the storage capacitor Cst and the gate of the drive transistor Tm are both located in the gate metal layer 02. The second electrode of the storage capacitor Cst is located on a side, away from the substrate 00, of the gate of the drive transistor Tm. In the embodiment shown in FIG. 13, the reset signal line Ref and the second electrode of the storage capacitor Cst are located in the same layer. The reset signal line Ref and the second electrode of the storage capacitor Cst are located in the capacitor metal layer 03. The auxiliary signal line F, the data line Data, and the positive power line are all located in the second metal layer 05.

In the display panel, a plurality of pixel circuits 10 are arranged in pixel circuit columns in the second direction b. FIG. 13 shows two pixel circuit columns, and each pixel circuit column is provided with one auxiliary signal line F. In other embodiments, every two or more pixel circuit columns are provided with one auxiliary signal line F, which is not illustrated in the figure herein.

Figure 14:
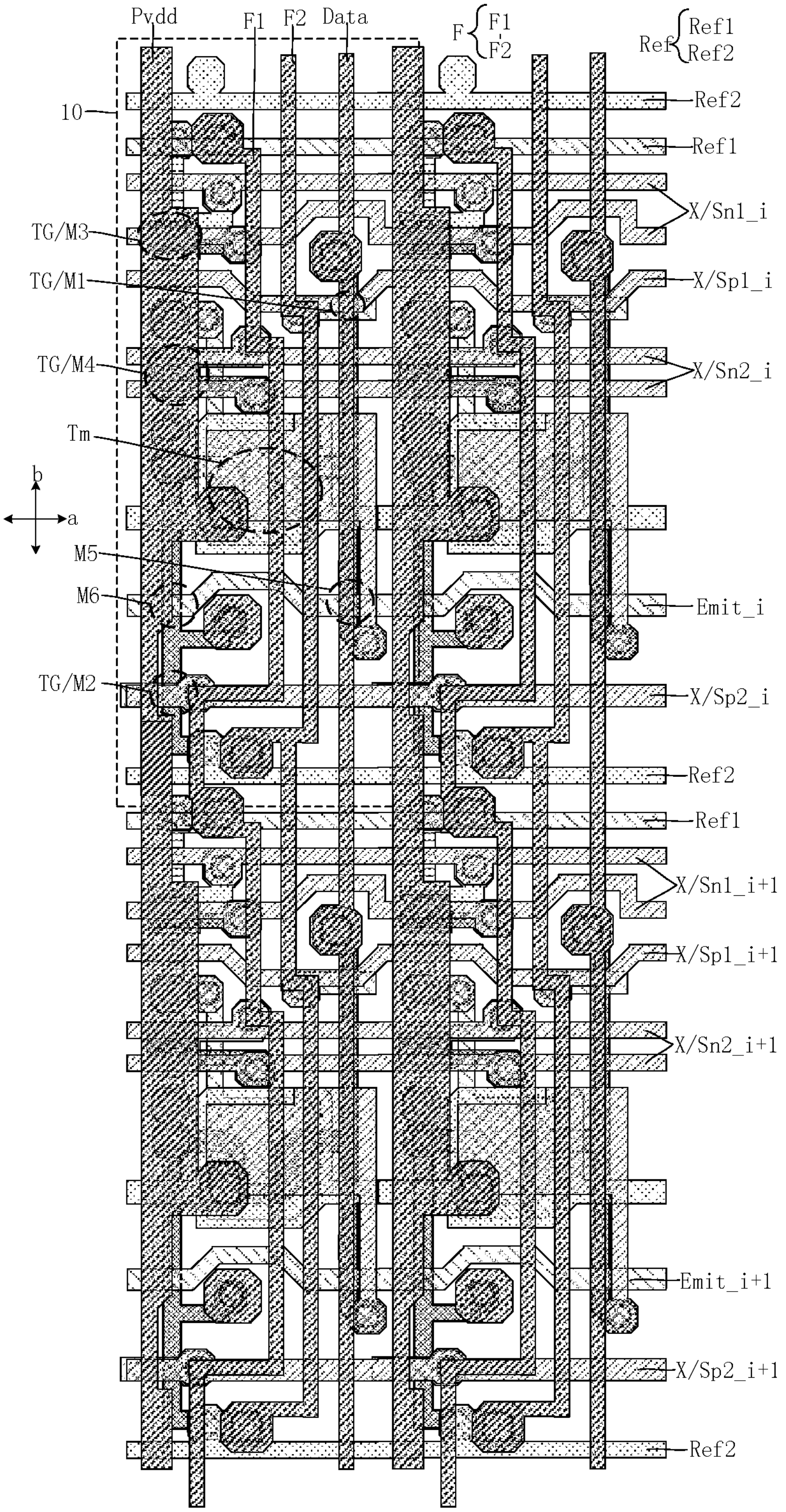
FIG. 14 is a schematic diagram of another display panel according to an embodiment of the present disclosure.

In other embodiments, reset signal lines and auxiliary signal lines are provided in the display panel. The electrode reset transistor M2 and the gate reset transistor M3 in the pixel circuit 10 receive different reset signals. FIG. 14 is a schematic diagram of another display panel according to an embodiment of the present disclosure. The pixel circuit 10 in FIG. 14 can be understood with reference to the embodiment shown in FIG. 2. FIG. 14 shows two pixel circuits 10 in the i-th pixel circuit row and two pixel circuits 10 in the (i+1)-th pixel circuit row. The pixel circuit 10 in the i-th pixel circuit row is connected to a scanning line Sn1_*i*, a scanning line Sn2_*i*, a scanning line Sp1_*i*, a scanning line Sp2_*i*, and a light-emitting control line Emit_i. The pixel circuit 10 in the (i+1)-th pixel circuit row is connected to a scanning line Sn1_*i*+1, a scanning line Sn2_*i*+1, a scanning line Sp1_*i*+1, a scanning line Sp2_*i*+1, and a light-emitting control line Emit_i+1.

As shown in FIG. 14, the reset signal line Ref includes a first reset signal line Ref1 and a second reset signal line Ref2. The gate reset transistor is connected to the first reset signal line Ref1, and the electrode reset transistor is connected to the second reset signal line Ref2. The auxiliary signal line F includes a first auxiliary signal line F1 and a second auxiliary signal line F2. The first auxiliary signal line F1 intersects with and is electrically connected to the first reset signal line Ref1, and the second auxiliary signal line F2 intersects with and is electrically connected to the second reset signal line Ref2.

With reference to the layer structure of the display panel shown in FIG. 8, the display panel includes a first semiconductor layer 01, a gate metal layer 02, a capacitor metal layer 03, a second semiconductor layer 06, a second gate metal layer 07, a first metal layer 04, and a second metal layer 05 that are all located on one side of the substrate 00. In some embodiments, the material of the gate metal layer 02, the capacitor metal layer 03, and the second gate metal layer 07 includes molybdenum. The material of the first metal layer 04 and the second metal layer 05 includes titanium and/or aluminum. The sheet resistance of the gate metal layer 02, the capacitor metal layer 03, and the second gate metal layer 07 is greater than the sheet resistance of the first metal layer 04 and the second metal layer 05. In the embodiment shown in FIG. 14, the first electrode of the storage capacitor Cst and the gate of the drive transistor Tm are both located in the gate metal layer 02. The second electrode of the storage capacitor Cst is located on a side, away from the substrate 00, of the gate of the drive transistor Tm, and the second electrode of the storage capacitor Cst is located in the capacitor metal layer 03. One of the first reset signal line Ref1 and the second reset signal line Ref2 is located in the same layer as the gate of the drive transistor Tm, while the other is located in the same layer as the second electrode of the storage capacitor Cst. FIG. 14 shows that the first reset signal line Ref1 is located in the gate metal layer 02, and the second reset signal line Ref2 is located in the capacitor metal layer 03. The first auxiliary signal line F1 and the second auxiliary signal line F2 are both located in the second metal layer 05. The first auxiliary signal line F1 and the second auxiliary signal line F2 are located in the same layer as the data line Data and the positive power line Pvdd.

In the embodiment shown in FIG. 14, the first reset signal line Ref1 and the second reset signal line Ref2 are provided, and the electrode reset transistor M2 and the gate reset transistor M3 receive different reset signals. The voltage amplitude of the first reset signal transmitted by the first reset signal line Ref1 is greater than the voltage amplitude of the second reset signal transmitted by the second reset signal line Ref2. A higher reset voltage is provided to the control terminal of the drive transistor Tm through the first reset signal line Ref1, such that threshold capture at the control terminal of the drive transistor Tm is faster. In the high-frequency display application or low-brightness (or low-gray-scale) display application, the threshold capture time at the control terminal of the drive transistor Tm is shorter. With faster threshold capture at the control terminal of the drive transistor Tm, the captured threshold is more accurate, thus reducing display unevenness. At the same time, a lower reset voltage is supplied to the electrode of the light-emitting element PD through the second reset signal line Ref2 to alleviate the problem of undesired emission of the light-emitting element PD, thus improving the low gray-scale display effect. The first reset signal line Ref1 and the second reset signal line Ref2 are extended in the same direction, and are located in different layers to avoid a large number of signal lines being arranged in the same film layer and reduce the overall space occupied by the pixel circuit 10. In addition, in the embodiment of the present disclosure, the first auxiliary signal line F1 and the second auxiliary signal line F2 are also provided. The auxiliary signal line F can reduce the voltage drop of the transmitted reset signal, thereby reducing the power consumption of the display panel and improving the display uniformity.

In the display panel, a plurality of pixel circuits 10 are arranged in pixel circuit columns in the second direction b. FIG. 14 shows two pixel circuit columns, each pixel circuit column is provided with one first auxiliary signal line F1 and one second auxiliary signal line F2. This design allows for a greater number of first auxiliary signal lines F1 and second auxiliary signal lines F2 to be set in the display panel, which can greatly reduce the voltage drop during transmission of the first reset signal and the second reset signal, and reduce the power consumption of the display panel while improving the display uniformity.

Figure 15:
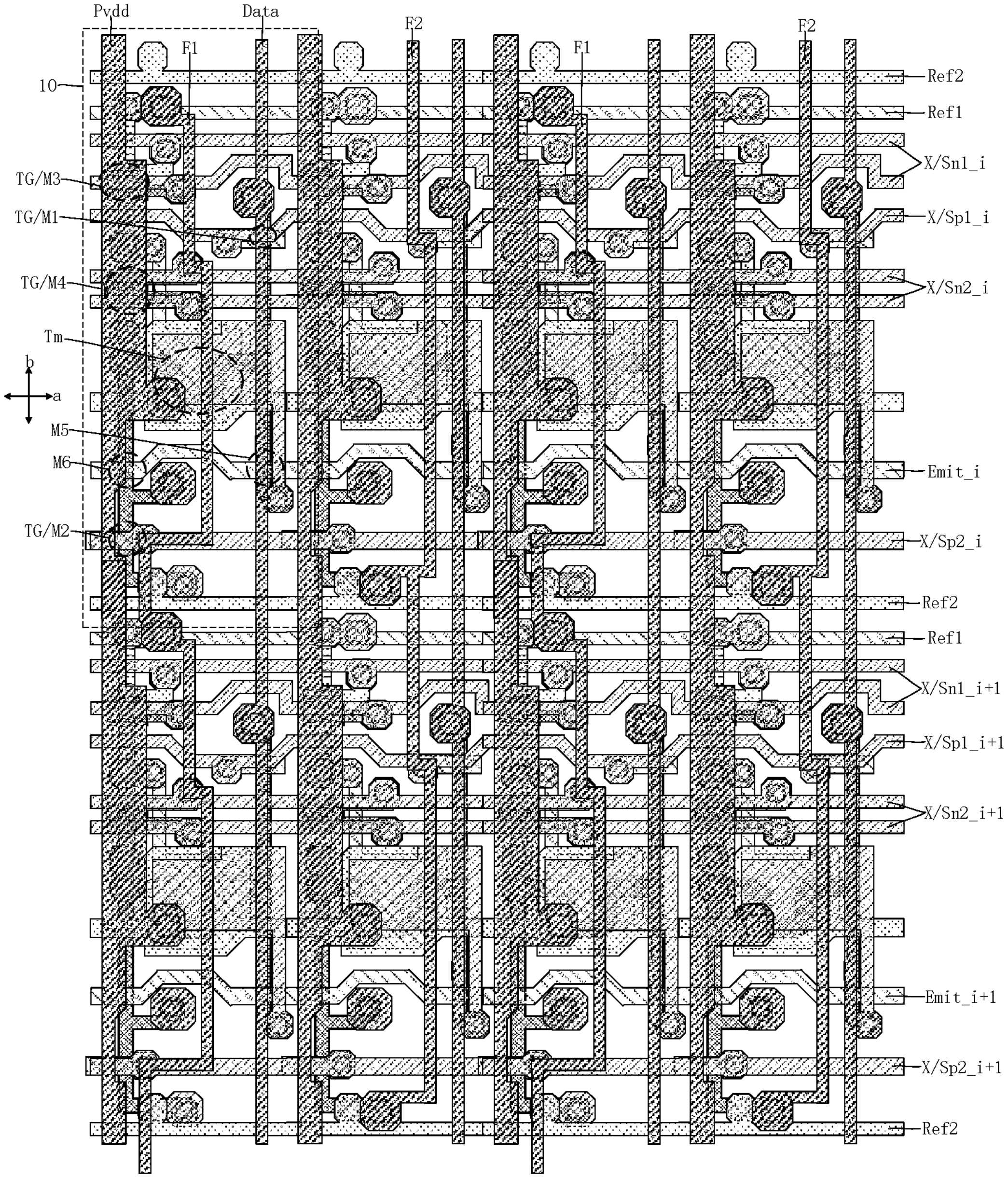
FIG. 15 is a schematic diagram of another display panel according to an embodiment of the present disclosure.

FIG. 15 is a schematic diagram of another display panel according to an embodiment of the present disclosure. In other embodiments, as shown in FIG. 15, a plurality of pixel circuits 10 are arranged in pixel circuit columns in the second direction b. Each pixel circuit column is provided with one auxiliary signal line F, and the first auxiliary signal lines F1 and second auxiliary signal lines F2 are arranged alternately along the first direction a. In this embodiment, the first auxiliary signal line F1 intersects with and is electrically connected to the first reset signal line Ref1, and the second auxiliary line F2 intersects with and is electrically connected to the second reset signal line Ref2, which can reduce the voltage drop during transmission of the first reset signal and the second reset signal, and improve the display uniformity. In addition, since each pixel circuit column is provided with one auxiliary signal line F, the number of auxiliary signal lines F is small, such that the auxiliary signal line F, the positive power line Pvdd, and the data line Data can be all located in the same layer, thereby simplifying the process and ensuring mutual insulation between different signal lines.

In some embodiments, as shown in FIG. 5, the display panel includes a power line P extending in the second direction b. The second direction b intersects with the first direction a. The pixel circuit 10 is electrically connected to the power line P, and the power line P includes the positive power line Pvdd. With reference to FIG. 7, the layer where the power line P is located is on a side, away from the substrate 00, of the layer where the gating line X is located. The power line P is located in the second metal layer 05, and the gating line X is located in the first metal layer 04. The pixel circuit 10 includes a second transistor. The active layer of the second transistor includes metal oxide. The second transistor includes a threshold compensation transistor M4 and a gate reset transistor M3. As shown in FIG. 5, the power line P covers the second transistor in the direction perpendicular to the plane where the substrate 00 is located. The power line P has a certain light blocking capability. By covering the threshold compensation transistor M4 and the gate reset transistor M3 with the power line P, light can be blocked from reaching the threshold compensation transistor M4 and the gate reset transistor M3, which can ensure stable characteristics of the threshold compensation transistor M4 and the gate reset transistor M3, thereby ensuring stable gate potential of the drive transistor Tm.

In some embodiments, referring to FIG. 5, FIG. 7, and FIG. 8, the display panel further includes a cover portion 20, which is located on a side of the drive transistor Tm away from the substrate 00. In the direction e perpendicular to the plane where the substrate 00 is located, the cover portion 20 overlaps with the active layer w of the drive transistor Tm. FIG. 7 shows that the active layer w of the drive transistor Tm is located in the first semiconductor layer 01. As shown in FIG. 7, the cover portion 20 is located in the same layer as the gating line X. In this embodiment, the cover portion 20 overlaps with and covers the active layer w of the drive transistor Tm, and is made of a metal material to have a certain light-blocking capability. The cover portion 20 can block light from reaching the active layer w of the drive transistor Tm, thereby ensuring the stable characteristics of the drive transistor Tm and the display effect. In addition, the cover portion 20 and the gating line X are located in the same layer and are made in the same manufacturing step, which not only makes reasonable use of the layer where the gating line X is located but also simplifies the manufacturing process.

In some embodiments, with reference to FIG. 7 and FIG. 8, the cover portion 20 and the gating line X are located in the first metal layer 04. The power line P is located in the second metal layer 05. The first electrode C1 of the storage capacitor Cst is located in the gate metal layer 02, while the second electrode C2 is located in the capacitor metal layer 03. In the direction e perpendicular to the plane where the substrate 00 is located, the layer where the cover portion 20 is located is between the layer where the power line P is located and the layer where the second electrode C2 of the storage capacitor Cst is located. The cover portion 20 is coupled to the power line P. Specifically, the power line P overlaps with the cover portion 20 and is electrically connected to the cover portion 20 through a second via V2. The cover portion 20 overlaps with the second electrode C2 of the storage capacitor Cst and is electrically connected to the second electrode C2 through a third via V3. In this embodiment, the cover portion 20 and the gating line X are located in the same layer, which can simplify the manufacturing process. The cover portion 20 is connected between the power line P and the second electrode C2 of the storage capacitor Cst, the depths of the second via V2 and the third via V3 are small, which can improve the yield of via connections, and also avoid the problem of large hole size that could affect the wiring space.

Furthermore, with reference to the foregoing embodiment in which the auxiliary signal line F is provided, the auxiliary signal line F extending in the second direction b may also be located in the same layer as the power line P. When the auxiliary signal line F is in the same layer as the power line P, there are more wiring traces in the layer where the power line P is located. By using the cover portion 20 to connect the second electrode C2 of the storage capacitor Cst to the power line P, the space occupied by the power line P in its layer can be reduced, thus reserving space for setting the auxiliary signal line F.

In some embodiments, with reference to FIG. 5 and FIG. 7, the display panel includes a node connection line 30. One terminal of the threshold compensation transistor M4 and one terminal of the gate reset transistor M3 are both connected to the node connection line 30. The node connection line 30 is connected to the gate Tmg of the drive transistor Tm. By using the node connection line 30, the threshold compensation transistor M4 and the gate reset transistor M3 are connected to the gate Tmg of the drive transistor Tm to provide a voltage signal to the gate Tmg of the drive transistor Tm. One terminal of the threshold compensation transistor M4 and one terminal of the gate reset transistor M3 are both led out from the layer where the active layer of the transistor is located. In the embodiment shown in FIG. 5, the active layer of the threshold compensation transistor M4 and the active layer of the gate reset transistor M3 are both located in the second semiconductor layer 06. The node connection line 30 is connected to the second semiconductor layer 06 through a via in the insulation layer. In the embodiment of the present disclosure, the node connection line 30 intersects with at least one gating line X in an insulated manner. The gating line X intersecting with the node connection line 30 is located in the first metal layer 04, that is, the gating line X and the gate Tmg of the drive transistor Tm are located in different layers, while the node connection line 30 and the gate Tmg of the drive transistor Tm are located in the same layer, such that the node connection line 30 is directly connected to the gate Tmg of the drive transistor Tm. Therefore, it is unnecessary to form a hole in the second electrode C2 on a side, away from the substrate 00, of the gate Tmg of the drive transistor Tm.

In the related art, the node connection line and the gate of the drive transistor are located in different layers. The layer where the node connection line is located is on a side, away from the gate of the drive transistor, of the layer where the second electrode of the storage capacitor is located. The node connection line needs to pass through a hole in the second electrode of the storage capacitor to be connected to the gate of the drive transistor. After a hole is formed in the second electrode of the storage capacitor, an overlapping area between the second electrode and the first electrode (the gate of the drive transistor is reused as the first electrode) becomes smaller. In order to ensure that the capacitance value of the storage capacitor meets the requirements, it may be necessary to increase the area of the second electrode on which the hole is formed. This causes the storage capacitor to occupy a larger area and space, which affects the wiring space of the display panel.

In the embodiment of the present disclosure, gating lines X are provided. The conductive structure TGg is electrically connected to the gating line X through a via. The sheet resistance of the layer where the gating line X is located is lower than the sheet resistance of the layer where the conductive structure TGg is located, which can reduce the resistance of the gating line X, thereby reducing the voltage drop during signal transmission through the gating line X. Since the gating line X and the gate Tmg of the drive transistor Tm are located in different layers, the node connection line 30 overlapping with the gating line X can be arranged in the same layer as the gate Tmg of the drive transistor Tm. Therefore, it is not necessary to form a hole in the second electrode C2 on a side, away from the substrate 00, of the gate Tmg of the drive transistor Tm. By ensuring that the capacitance value of the storage capacitor Cst meets the requirements, the area and space occupied by the storage capacitor Cst are reduced, thereby saving the wiring space of the display panel.

In addition, as shown in FIG. 3, the node connection line 30 intersects with one gating line X in an insulated manner; the node connection line 30 is in the same layer as and directly connected to the gate Tmg of the drive transistor Tm.

In some embodiments, with reference to FIG. 5 and FIG. 7, the active layer M4*w* of the threshold compensation transistor M4 is located on one side of the node connection line 30 in the first direction a. The conductive structure TGg of the threshold compensation transistor M4 is electrically connected to the gating line X through a third via V3. In the embodiment shown in FIG. 5, the conductive structure TGg of the threshold compensation transistor M4 includes a first gate 1TGg and a second gate 2TGg. The first gate 1TGg is electrically connected to the first gating sub-line 2Xa through the via O1, and the second gate 2TGg is electrically connected to the second gating sub-line 2Xb through the via O2, i.e., the fourth via V4 includes the via O1 and the via O2. It can be seen from FIG. 5 that the active layer of the threshold compensation transistor M4 and the fourth via V4 are located at two sides of the node connection line 30 respectively. This design makes the node connection line 30 shorter, such that the node connection line 30 has lower resistance and lower voltage drop.

Figure 16:
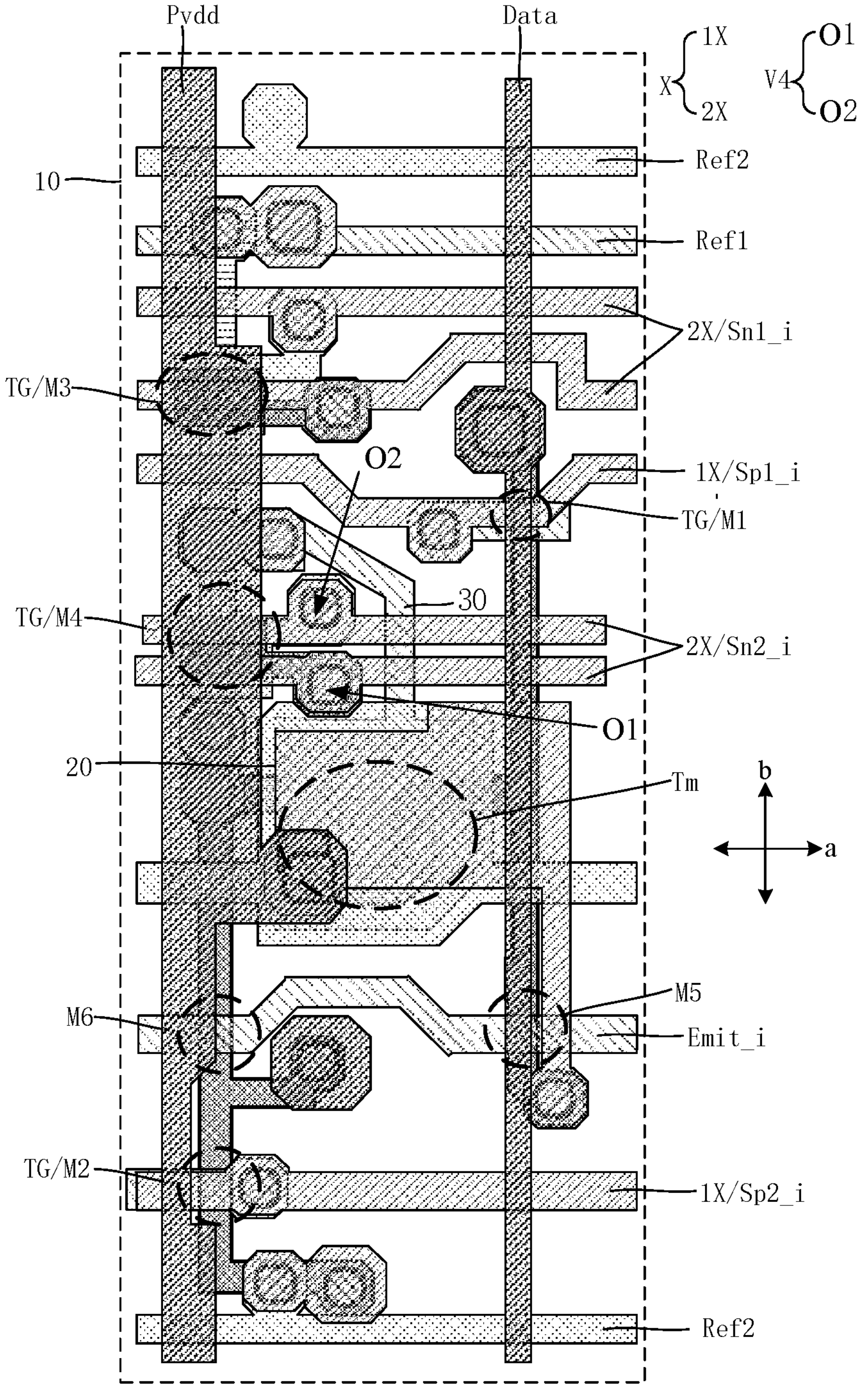
FIG. 16 is a schematic diagram of another display panel according to an embodiment of the present disclosure.

FIG. 16 is a schematic diagram of another display panel according to an embodiment of the present disclosure. FIG. 16 shows one pixel circuit 10 in the i-th pixel circuit row. In other embodiments, as shown in FIG. 16, the threshold compensation transistor M4 is located on one side of the node connection line 30 in the first direction a, and thus the active layer of the threshold compensation transistor M4 is also located on one side of the node connection line 30 in the first direction a. The conductive structure TGg of the threshold compensation transistor M4 (referring to FIG. 7) is electrically connected to the gating line X through the fourth via V4. The conductive structure TGg of the threshold compensation transistor M4 and the fourth via V4 are located on the same side of the node connection line 30. This design avoids overlap between the node connection line 30 and the conductive structure TGg, which would otherwise result in a large coupling capacitance on the node connection line 30 and affect the stability of the gate potential of the drive transistor Tm.

Figure 17:
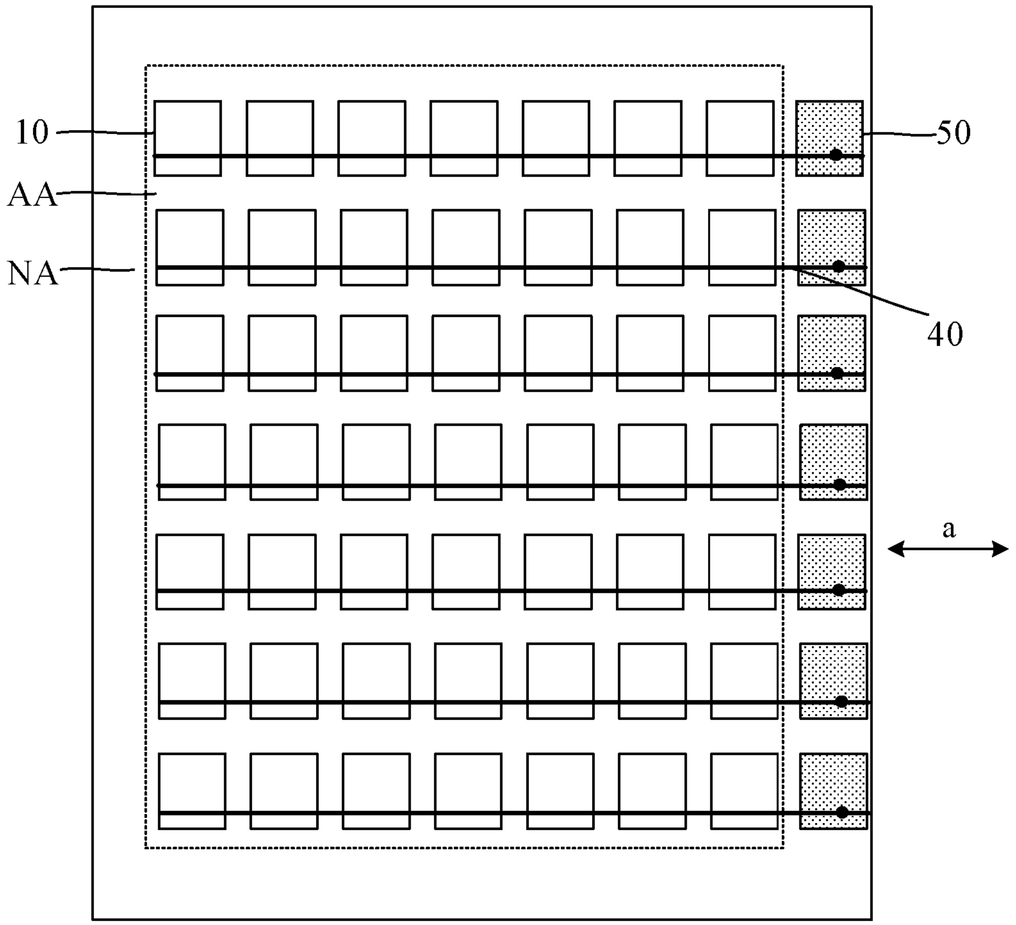
FIG. 17 is a simplified schematic diagram of another display panel according to an embodiment of the present disclosure.

In some embodiments, repair lines and repair pixel circuits are further provided in the display panel. The repair lines are configured to repair defects in pixels in the display area. FIG. 17 is a simplified schematic diagram of another display panel according to an embodiment of the present disclosure. As shown in FIG. 17, the display panel includes repair lines 40. Each repair line 40 is connected to a repair pixel circuit 50 located in a non-display area NA. The structure of the repair pixel circuit 50 is the same as that of the pixel circuit 10 in the display area AA. FIG. 17 shows that one repair pixel circuit 50 is provided corresponding to each pixel circuit row arranged in the first direction a. When there is a defect in the pixel circuit 10, the repair line 40 is connected to the corresponding light-emitting element, such that the repair pixel circuit 50 drives the light-emitting element. The repair pixel circuit 50 replaces the defective pixel circuit 10 to drive the light-emitting element for normal light emission.

Figure 18:
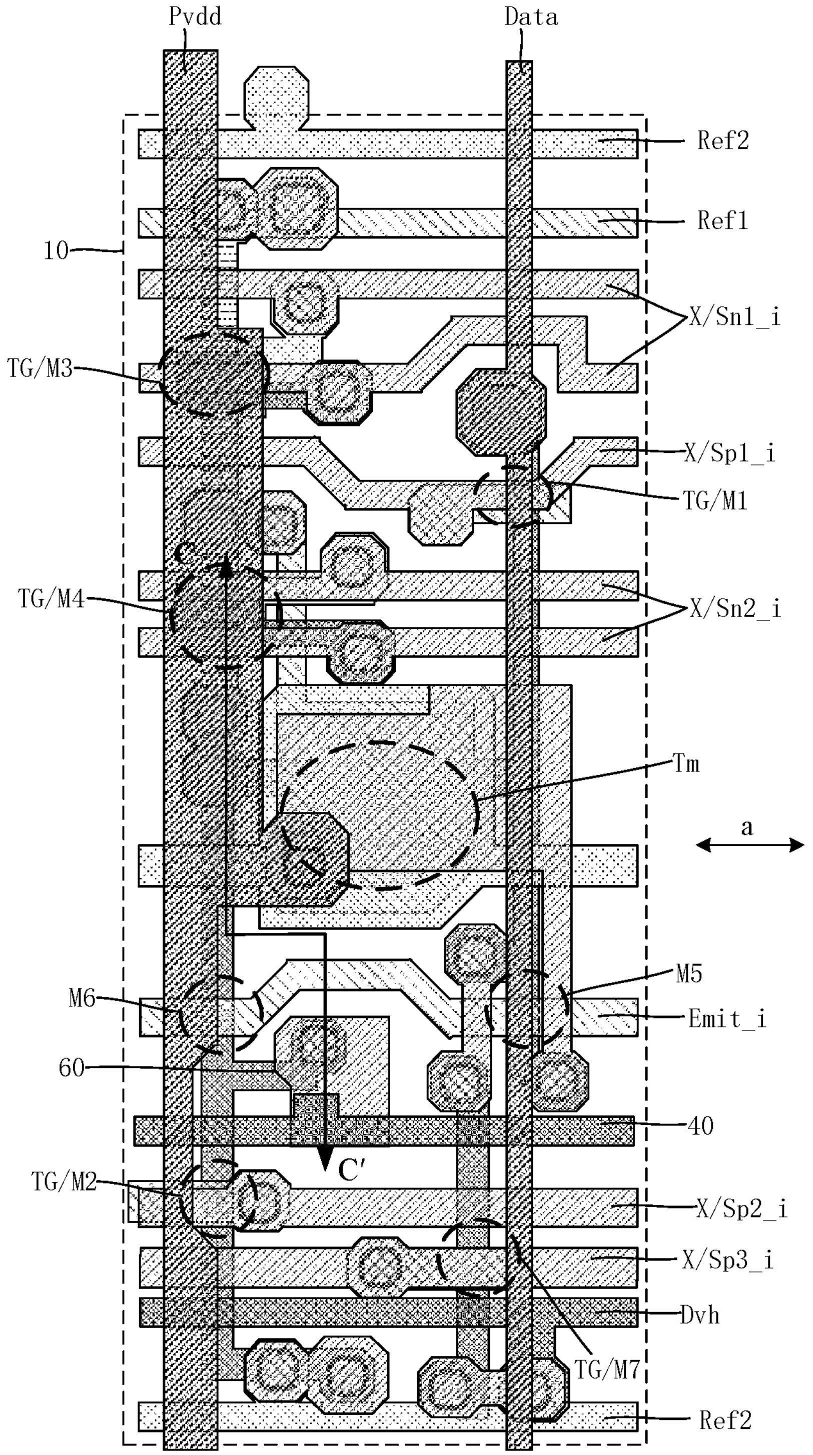
FIG. 18 is a schematic diagram of another display panel according to an embodiment of the present disclosure.
Figure 19:
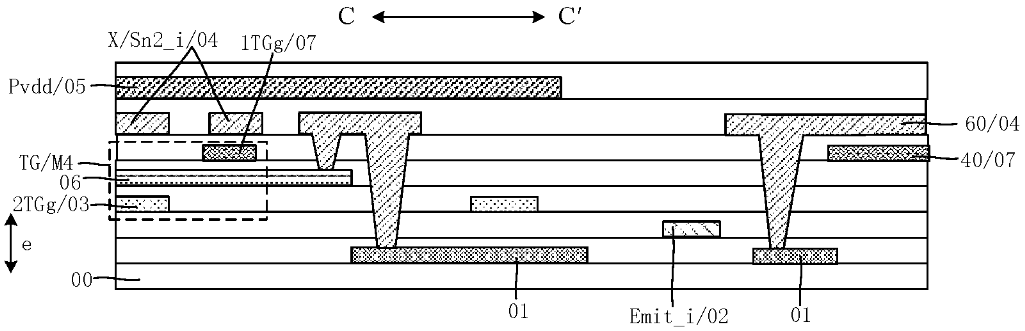
FIG. 19 is a schematic cross-sectional view taken along line C-C' in FIG. 18.

FIG. 18 is a schematic diagram of another display panel according to an embodiment of the present disclosure. FIG. 19 is a schematic cross-sectional view taken along line C-C' in FIG. 18. FIG. 18 shows the repair line 40 in the display panel. The pixel circuit 10 shown in FIG. 18 can be understood with reference to the embodiments shown in FIG. 9 and FIG. 10. The pixel circuit 10 shown in FIG. 18 includes a first transistor and a second transistor. The active layer of the first transistor includes silicon, and the active layer of the second transistor includes metal oxide. The first transistor includes a drive transistor Tm, a data writing transistor M1, an electrode reset transistor M2, a bias adjustment transistor M7, a first light-emitting control transistor M5, and a second light-emitting control transistor M6. The second transistor includes a gate reset transistor M3 and a threshold compensation transistor M4.

As shown in FIG. 18, the display panel is provided with a connection electrode 60. The light-emitting element (not shown in FIG. 18) is coupled to the pixel circuit 10 through the connection electrode 60. The display panel further includes repair lines 40 extending in the first direction a. With reference to FIG. 19, the repair line 40 overlaps with the connection electrode 60 in the direction e perpendicular to the plane where the substrate 00 is located.

FIG. 19 shows the layer structure of the display panel. The display panel includes a first semiconductor layer 01, a gate metal layer 02, a capacitor metal layer 03, a first metal layer 04, a second metal layer 05, a second semiconductor layer 06, and a second gate metal layer 07 that are all located above the substrate 00.

FIG. 19 shows the threshold compensation transistor M4 which is one of the second transistors. The threshold compensation transistor M4 includes a first conductive structure 1TGg and a second conductive structure 2TGg. The first conductive structure 1TGg is located on a side, away from the substrate 00, of the active layer of the threshold compensation transistor M4. The layer where the gating line X is located is on a side, away from the substrate 00, of the active layer of the threshold compensation transistor M4. The active layer of the threshold compensation transistor M4 is located in the second semiconductor layer 06. The first conductive structure 1TGg is located in the second gate metal layer 07, and the second conductive structure 2TGg is located in the capacitor metal layer 03. The gating line X is located in the first metal layer 04. The repair line 40 is located in the same layer as the first conductive structure 1TGg, that is, the repair line 40 is located in the same layer as the first gate of the second transistor. The connection electrode 60 is located in the same layer as the gating line X. When a pixel on the display panel has defect, the repair line 40 is fused with the connection electrode 60 at the overlapping position by using a laser, such that the repair line 40 is electrically connected to the connection electrode 60. Therefore, the repair pixel circuit 50 can be used to drive the light-emitting element connected to the connection electrode 60. In the embodiment of the present disclosure, the repair line 40 is disposed in the second gate metal layer 07, and the connection electrode 60 is disposed in the first metal layer 04. The repair line 40 and the connection electrode 60 are relatively close to each other in the direction perpendicular to the plane where the substrate 00 is located, and the layer between the repair line 40 and the connection electrode 60 is thin. Therefore, it is easier to connect the repair line 40 and the connection electrode 60 during laser fusion, which can increase the probability of successful repair.

Figure 20:
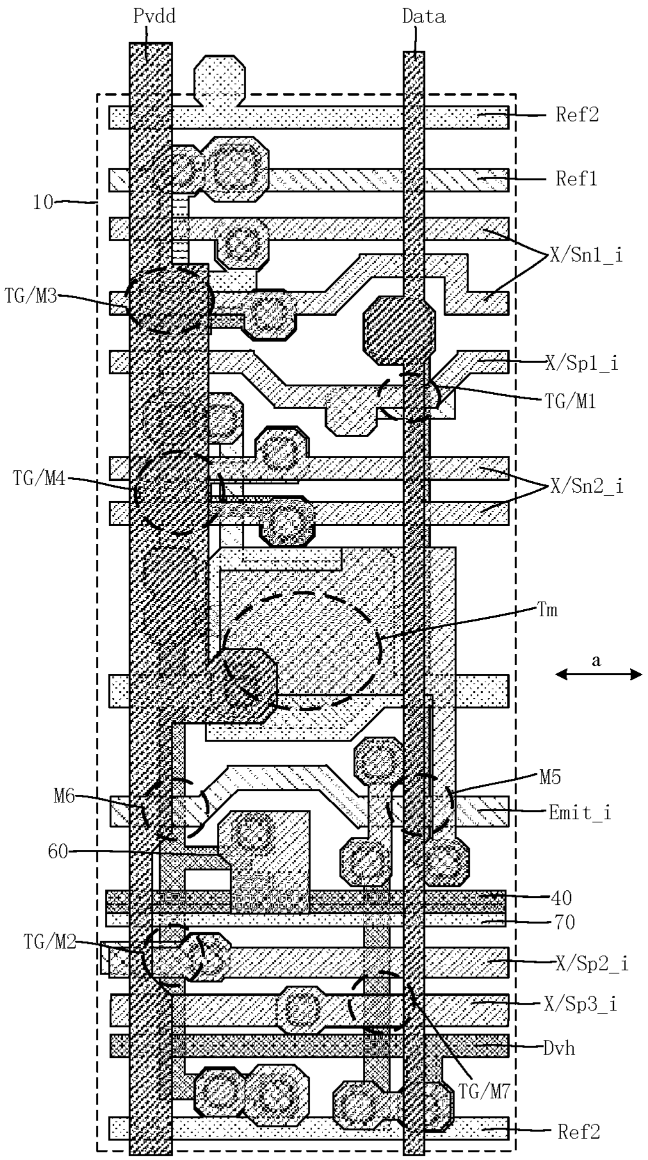
FIG. 20 is a schematic diagram of another display panel according to an embodiment of the present disclosure.

FIG. 20 is a schematic diagram of another display panel according to an embodiment of the present disclosure. In other embodiments, as shown in FIG. 20, the display panel further includes an auxiliary repair line 70. FIG. 20 is a top view of the display panel, and the top view direction of the display panel is parallel to the direction perpendicular to the plane where the substrate 00 is located. It can be seen from FIG. 20 that in the direction perpendicular to the plane where the substrate 00 is located, the auxiliary repair line 70 overlaps with the connection electrode 60. In the embodiment shown in FIG. 18, the layers where the two electrodes of the storage capacitor Cst (not labeled in FIG. 18) are located are the same as those in the embodiments shown in FIG. 5 and FIG. 7. That is, the first electrode of the storage capacitor Cst is located in the same layer as the gate of the drive transistor Tm, and the second electrode of the storage capacitor Cst is located on a side of the gate of the drive transistor Tm away from the substrate 00. The first electrode of the storage capacitor Cst is located in the gate metal layer 02, and the second electrode of the storage capacitor Cst is located in the capacitor metal layer 03. Optionally, the auxiliary repair line 70 is located in the same layer as the second electrode of the storage capacitor Cst. The auxiliary repair line 70 is electrically connected to the repair pixel circuit in the non-display area. Defective pixels within the display area can be repaired by using the auxiliary repair line 70. In this embodiment, the repair line 40 and the auxiliary repair line 70 are provided, which can improve the success probability of replacement. Additionally, the parallel connection of the repair line 40 and the auxiliary repair line 70 can reduce the resistance to lower the voltage drop, thereby improving the brightness accuracy of the light-emitting element driven by the repair pixel circuit.

In some embodiments, as shown in FIG. 20, the repair line 40 at least partially overlaps with the auxiliary repair line 70 in the direction perpendicular to the plane where the substrate 00 is located. The repair line 40 and the auxiliary repair line 70 are located in different film layers. The repair line 40 and the auxiliary repair line 70 at least partially overlap with each other, which can save the wiring space of the display panel. In addition, the repair line 40 and the auxiliary repair line 70 can also be connected through vias in the insulation layer at appropriate positions, which can reduce the voltage drop on the repair line and improve the brightness accuracy of the light-emitting element driven by the repair pixel circuit.

Figure 21:
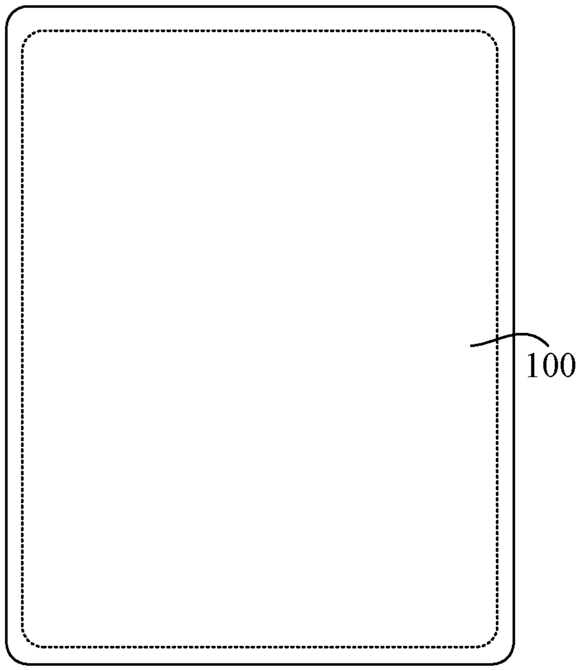
FIG. 21 is a schematic diagram of a display apparatus according to an embodiment of the present disclosure.

Based on the same inventive concept, an embodiment of the present disclosure further provides a display apparatus. FIG. 21 is a schematic diagram of a display apparatus according to an embodiment of the present disclosure. As shown in FIG. 21, the display apparatus includes the display panel 100 provided in any embodiment of the present disclosure. The structure of the display panel 100 has been described in the foregoing embodiments, and details are not described herein again. The display apparatus may be, for example, a display device such as a mobile phone, a tablet computer, a notebook computer, a television, or an intelligent wearable product.

The above descriptions are merely preferred embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the corresponding technical solutions deviate from the scope of the technical solutions of the embodiments of the present disclosure.

What is claimed is:

1. A display panel, comprising: a substrate, gating lines, a power line and pixels, wherein the gating lines and the pixels are located on a side of the substrate, wherein:

the gating lines extend in a first direction, a pixel of the pixels comprises a pixel circuit, the pixel circuit comprises a functional transistor, the functional transistor comprises a patterned conductive structure, and a gate of the functional transistor is located in the conductive structure, the conductive structure is electrically connected to a gating line of the gating lines through a via, and a sheet resistance of a layer where the gating line is located is lower than a sheet resistance of a layer where the conductive structure is located, the power line extends in a second direction, the second direction intersects with the first direction, wherein the pixel circuit is electrically connected to the power line, and a layer where the power line is located is on a side of the layer where the gating line is located away from the substrate, the pixel circuit comprises a second transistor, and an active layer of the second transistor contains metal oxide, and in a direction perpendicular to a plane where the substrate is located, the power line covers the second transistor.

2. The display panel according to claim 1, wherein in a direction perpendicular to a plane where the substrate is located, the gate of the functional transistor at least partially overlaps with the gating line connected to the conductive structure of the functional transistor.

3. The display panel according to claim 1, wherein material of the gating lines comprises aluminum and titanium, and material of the conductive structure comprises molybdenum.

4. The display panel according to claim 1, wherein at least one of:

the pixel circuit comprises a first transistor, an active layer of the first transistor comprises silicon, and the functional transistor comprises at least one first transistor; or the pixel circuit comprises a second transistor, an active layer of the second transistor comprises metal oxide, and the functional transistor comprises at least one second transistor.

5. The display panel according to claim 4, wherein the gating lines comprise a first gating line, and the conductive structure of the first transistor is electrically connected to the first gating line through a via, the gating lines further comprise a second gating line, and the conductive structure of the second transistor is electrically connected to the second gating line through a via, and the first gating line and the second gating line are located in a same layer.

6. The display panel according to claim 5, wherein the conductive structure of the second transistor comprises a first conductive structure and a second conductive structure, and the second transistor comprises a first gate located in the first conductive structure and a second gate located in the second conductive structure, and in a direction perpendicular to a plane where the substrate is located, the first conductive structure and the second conductive structure are located on two sides of the active layer of the second transistor respectively, and the second gating line comprises a first gating sub-line and a second gating sub-line, the first conductive structure is electrically connected to the first gating sub-line through a via, and the second conductive structure is electrically connected to the second gating sub-line through a via.

7. The display panel according to claim 6, wherein the via between the first conductive structure and the first gating sub-line, and the via between the second conductive structure and the second gating sub-line are located on a same side of the active layer of the second transistor.

8. The display panel according to claim 6, wherein the pixel circuit comprises a drive transistor and a storage capacitor, the storage capacitor comprises a first electrode located in a same layer as a gate of the drive transistor, and a second electrode located on a side of the first electrode away from the substrate, the first conductive structure is located on a side of the second electrode away from the substrate, and the second conductive structure is located in a same layer as the second electrode, the second transistor comprises a first sub-transistor, and in a second direction, the first conductive structure of the first sub-transistor is located between the second conductive structure of the first sub-transistor and the second electrode of the storage capacitor, the second direction intersecting with the first direction and being parallel to the plane where the substrate is located.

9. The display panel according to claim 8, further comprising a cover portion located on a side of the drive transistor away from the substrate, wherein in the direction perpendicular to the plane where the substrate is located, the cover portion overlaps with an active layer of the drive transistor, and in the second direction, the cover portion is adjacent to the first gating sub-line, the cover portion is provided with a notch at an end adjacent to the first gating sub-line, and the notch partially surrounds the via between the first conductive structure and the first gating sub-line.

10. The display panel according to claim 5, further comprising a data line for transmitting a data signal, the pixel circuit comprising a data receiving terminal located in a same layer as the active layer of the first transistor, and the data receiving terminal being connected to the data line through a first via, wherein:

the second transistor comprises a second sub-transistor, the second sub-transistor comprises the conductive structure, and the second gating line comprises a detour gating line electrically connected to the conductive structure of the second sub-transistor, wherein the detour gating line surrounds half of the first via on a side of the first via.

11. The display panel according to claim 4, wherein the pixel circuit comprises a drive transistor, a data writing transistor, an electrode reset transistor, a gate reset transistor, a threshold compensation transistor, a first light-emitting control transistor, and a second light-emitting control transistor, wherein the drive transistor is connected in series between the first light-emitting control transistor and the second light-emitting control transistor, a gate of the drive transistor is connected to a first node, the drive transistor comprises a first electrode connected to a second node and a second electrode connected to a third node, the gate reset transistor is connected to the first node, the data writing transistor and the first light-emitting control transistor are connected to the second node, the threshold compensation transistor is connected in series between the first node and the third node, the second light-emitting control transistor comprises a first electrode connected to the third node and a second electrode connected to a fourth node, and the electrode reset transistor is connected to the fourth node, the first transistor comprises the data writing transistor and the electrode reset transistor, and the second transistor comprises the gate reset transistor and the threshold compensation transistor.

12. The display panel according to claim 11, wherein the pixel circuit comprises a bias transistor configured to adjust a bias state of the drive transistor, and the bias transistor is connected to the second node or the third node, and the first transistor comprises the bias transistor.

13. The display panel according to claim 12, wherein the functional transistor comprises the bias transistor and the electrode reset transistor, the conductive structure of the bias transistor and the conductive structure of the electrode reset transistor in a same pixel circuit are formed in one piece.

14. The display panel according to claim 1, further comprising a reset signal line extending in the first direction and an auxiliary signal line extending in a second direction, the second direction intersecting with the first direction, wherein the pixel circuit is connected to the reset signal line, and the auxiliary signal line intersects with and is electrically connected to the reset signal line, and a layer where the reset signal line is located is on a side of a layer where the auxiliary signal line is located adjacent to the substrate, and the layer where the auxiliary signal line is located is on a side of the layer where the gating line is located away from the substrate.

15. The display panel according to claim 14, wherein the pixel circuit comprises a gate reset transistor and an electrode reset transistor, both the gate reset transistor and the electrode reset transistor being connected to the reset signal line, the pixel circuit further comprises a storage capacitor, a first electrode of the storage capacitor is located in a same layer as the gate of the drive transistor, and a second electrode of the storage transistor is located on a side of the gate of the drive transistor away from the substrate, and the reset signal line and the second electrode of the storage capacitor are located in a same layer.

16. The display panel according to claim 14, wherein the pixel circuit comprises a drive transistor, a gate reset transistor, and an electrode reset transistor, the reset signal line comprises a first reset signal line and a second reset signal line, and the gate reset transistor is connected to the first reset signal line, and the electrode reset transistor is connected to the second reset signal line, the auxiliary signal line comprises a first auxiliary signal line, and the first auxiliary signal line intersects with and is electrically connected to the first reset signal line, and/or the auxiliary signal line comprises a second auxiliary signal line, and the second auxiliary signal line intersects with and is electrically connected to the second reset signal line, the pixel circuit further comprises a storage capacitor, a first electrode of the storage capacitor is located in a same layer as the gate of the drive transistor, and a second electrode of the storage transistor is located on a side of the gate of the drive transistor away from the substrate, and one of the first reset signal line and the second reset signal line is located in a same layer as the gate of the drive transistor, and the other one is located in a same layer as the second electrode.

17. The display panel according to claim 16, wherein the pixel circuits are arranged in pixel circuit columns in the second direction, and a pixel circuit column of the pixel circuit columns is provided with one first auxiliary signal line and one second auxiliary signal line.

18. The display panel according to claim 16, wherein the pixel circuits are arranged in pixel circuit columns in the second direction, a pixel circuit column of the pixel circuit columns is provided with one auxiliary signal line, and the first auxiliary signal lines and the second auxiliary signal lines are arranged alternately in the first direction.

19. The display panel according to claim 1, wherein the pixel circuit comprises a drive transistor, the display panel further comprises a cover portion that is located on a side of the drive transistor away from the substrate, and in the direction perpendicular to the plane where the substrate is located, the cover portion overlaps with an active layer of the drive transistor, and the cover portion and the gating line are located in a same layer.

20. The display panel according to claim 19, wherein the pixel circuit further comprises a storage capacitor, a first electrode of the storage capacitor is located in a same layer as a gate of the drive transistor, and a second electrode of the storage transistor is located on a side of the gate of the drive transistor away from the substrate, a layer where the cover portion is located is between a layer where the second electrode is located and the layer where the power line is located, the power line and the cover portion overlap with each other, and are electrically connected through a second via, and the cover portion and the second electrode overlap with each other, and are electrically connected through a third via.

21. The display panel according to claim 1, wherein the pixel circuit comprises a drive transistor;

the display panel comprises a node connection line connected to a gate of the drive transistor, and the node connection line intersects with at least one gating line in an insulated manner, and the node connection line is located in a same layer as the gate of the drive transistor.

22. The display panel according to claim 21, wherein the pixel circuit comprises a threshold compensation transistor, and an active layer of the threshold compensation transistor is located on a side of the node connection line in the first direction, the functional transistor comprises the threshold compensation transistor, and the conductive structure of the threshold compensation transistor is electrically connected to the gating line through a fourth via, and the active layer of the threshold compensation transistor and the fourth via are located on two sides of the node connection line respectively.

23. The display panel according to claim 20, wherein the pixel circuit comprises a threshold compensation transistor, and an active layer of the threshold compensation transistor is located on a side of the node connection line in the first direction, the functional transistor comprises the threshold compensation transistor, and the conductive structure of the threshold compensation transistor is electrically connected to the gating line through a fourth via, and the conductive structure of the threshold compensation transistor and the fourth via are located on a same side of the node connection line.

24. The display panel according to claim 1, wherein the pixel further comprises a light-emitting element coupled to the pixel circuit through a connection electrode, the display panel further comprises a repair line extending in the first direction and configured to repair a defect of the pixel, and in a direction perpendicular to a plane where the substrate is located, the repair line overlaps with the connection electrode, the pixel circuit comprises a second transistor, an active layer of the second transistor comprises metal oxide, the second transistor comprises a first gate located on a side of the active layer of the second transistor away from the substrate, and a layer where the gating line is located is on the side of the active layer of the second transistor away from the substrate, and the repair line is located in a same layer as the first gate, and the connection electrode is located in a same layer as the gating line.

25. The display panel according to claim 24, further comprising an auxiliary repair line, wherein in the direction perpendicular to the plane where the substrate is located, the auxiliary repair line overlaps with the connection electrode, the pixel circuit comprises a drive transistor and a storage capacitor, a first electrode of the storage capacitor is located in a same layer as a gate of the drive transistor, and a second electrode of the storage transistor is located on a side of the gate of the drive transistor away from the substrate, and the auxiliary repair line is located in a same layer as the second electrode.

26. The display panel according to claim 24, wherein in the direction perpendicular to the plane where the substrate is located, the repair line at least partially overlaps with the auxiliary repair line.

27. A display apparatus comprising a display panel, wherein the display panel comprises:

a substrate, gating lines, a power line and pixels, wherein the gating lines and the pixels are located on a side of the substrate, wherein:

the gating lines extend in a first direction, each pixel comprises a pixel circuit, the pixel circuit comprises a functional transistor, the functional transistor comprises a patterned conductive structure, and a gate of the functional transistor is located in the conductive structure, the conductive structure is electrically connected to a gating line of the gating lines through a via, and a sheet resistance of a layer where the gating line is located is lower than a sheet resistance of a layer where the conductive structure is located, the power line extends in a second direction, the second direction intersects with the first direction, wherein the pixel circuit is electrically connected to the power line, and a layer where the power line is located is on a side of the layer where the gating line is located away from the substrate, the pixel circuit comprises a second transistor, and an active layer of the second transistor contains metal oxide, and in a direction perpendicular to a plane where the substrate is located, the power line covers the second transistor.

* * * * *